United States Patent
Khlat et al.

(10) Patent No.: US 9,973,173 B2
(45) Date of Patent: May 15, 2018

(54) SWITCH TOPOLOGY FOR SWITCHING FILTERS MULTIPLEXERS

(71) Applicant: RF Micro Devices, Inc., Greensboro, NC (US)

(72) Inventors: Nadim Khlat, Midi-Pyrenees (FR); Marcus Granger-Jones, Scotts Valley, CA (US)

(73) Assignee: Qorvo US, Inc., Greensboro, NC (US)

( * ) Notice: Subject to any disclaimer, the term of this patent is extended or adjusted under 35 U.S.C. 154(b) by 113 days.

(21) Appl. No.: 15/010,829

(22) Filed: Jan. 29, 2016

(65) Prior Publication Data
US 2017/0005385 A1 Jan. 5, 2017

Related U.S. Application Data

(60) Provisional application No. 62/186,780, filed on Jun. 30, 2015, provisional application No. 62/202,968, filed on Aug. 10, 2015.

(51) Int. Cl.
| | |
|---|---|
| *H01P 1/10* | (2006.01) |
| *H01P 1/213* | (2006.01) |
| *H03H 19/00* | (2006.01) |
| *H04B 1/00* | (2006.01) |
| H04B 1/44 | (2006.01) |
| H03H 7/46 | (2006.01) |

(52) U.S. Cl.
CPC .......... *H03H 19/002* (2013.01); *H04B 1/006* (2013.01); *H03H 7/465* (2013.01); *H03H 2250/00* (2013.01)

(58) Field of Classification Search
CPC .................... H01P 1/10; H04B 1/48

USPC ............................................ 333/101; 455/78
See application file for complete search history.

(56) References Cited

U.S. PATENT DOCUMENTS

| 7,352,259 B2 * | 4/2008 | Ehlers .................. H03H 11/245 327/308 |
|---|---|---|
| 8,068,805 B2 | 11/2011 | Guda et al. |
| 8,160,510 B2 * | 4/2012 | Kanou .................. H04B 1/0064 455/130 |
| 8,320,847 B2 | 11/2012 | Weber et al. |

(Continued)

OTHER PUBLICATIONS

Notice of Allowance for U.S. Appl. No. 15/235,789, dated Mar. 14, 2017, 8 pages.

*Primary Examiner* — Dean Takaoka
(74) *Attorney, Agent, or Firm* — Withrow & Terranova, P.L.L.C.

(57) ABSTRACT

This disclosure relates to radio frequency (RF) front end circuitry used to route RF signals. In one embodiment, the RF front end circuitry has a filter circuit and a switch device. The switch device includes a common port, an RF port, and switchable path connected in series between the common port and the RF port. The switch device is configured to present approximately the filter capacitance of the filter circuit at the common port when the switchable path is closed. However, when the switchable path is open, the switch device is configured to present a device capacitance at the common port that is approximately equal to the filter capacitance of the filter circuit. In this manner, if the common port is connected to an antenna, the capacitance seen by the antenna from the common port remains substantially unchanged regardless of which of the switchable path is opened or closed.

20 Claims, 11 Drawing Sheets

(56) References Cited

U.S. PATENT DOCUMENTS

| | | |
|---|---|---|
| 8,680,947 B1 | 3/2014 | Costa et al. |
| 8,803,632 B2 * | 8/2014 | Takeuchi ................. H03H 7/38 333/101 |
| 8,918,067 B2 * | 12/2014 | Parker ................. H04B 1/0458 326/30 |
| 9,118,100 B2 | 8/2015 | Khlat |
| 9,118,376 B2 | 8/2015 | Khlat et al. |
| 9,172,422 B2 | 10/2015 | Desclos et al. |
| 9,190,699 B2 | 11/2015 | Granger-Jones et al. |
| 9,203,596 B2 | 12/2015 | Granger-Jones |
| 9,219,594 B2 | 12/2015 | Khlat et al. |
| 9,419,775 B2 | 8/2016 | Granger-Jones |
| 9,705,203 B2 * | 7/2017 | Khlat ................. H01Q 21/0006 |
| 2013/0241666 A1 * | 9/2013 | Granger-Jones .......... H01P 1/15 333/101 |
| 2013/0250819 A1 * | 9/2013 | Khlat ..................... H04B 1/10 370/278 |
| 2013/0335160 A1 | 12/2013 | Khlat |
| 2014/0009248 A1 * | 1/2014 | Granger-Jones ........ H03J 5/246 333/174 |
| 2014/0073267 A1 * | 3/2014 | Cabanillas ........... H04B 1/0458 455/79 |
| 2015/0133067 A1 | 5/2015 | Chang et al. |
| 2015/0222026 A1 | 8/2015 | Tombak et al. |
| 2015/0303976 A1 | 10/2015 | Khlat et al. |
| 2015/0326326 A1 | 11/2015 | Nobbe et al. |
| 2016/0065167 A1 | 3/2016 | Granger-Jones et al. |
| 2016/0119003 A1 | 4/2016 | Granger-Jones et al. |

\* cited by examiner

SWITCH TOPOLOGY FOR SWITCHING FILTERS MULTIPLEXERS

RELATED APPLICATIONS

This application claims the benefit of provisional patent application Ser. Nos. 62/186,780 and 62/202,968, filed Jun. 30, 2015 and Aug. 10, 2015, respectively, the disclosures of which are hereby incorporated herein by reference in their entirety.

FIELD OF THE DISCLOSURE

This disclosure relates generally to Radio Frequency (RF) front end circuitry used to route RF signals.

BACKGROUND

Radio frequency (RF) front end circuitry is utilized in mobile communication devices (e.g., laptops, cellular phones, tablets, etc.) to handle RF signals transmitted to the mobile communication devices and/or received by the mobile communication devices. Manufacturers and consumers of mobile communication devices continue to demand increasingly greater rates of data exchange (data rates) and the ability to handle RF signals formatted in accordance with an increasing variety of RF communication standards and RF communication specifications. As such, the RF front end circuitry may include RF transceiver circuitry with a plurality of different transmit chains and receiver chains in order to process the various types of RF signals. The RF front end circuitry may thus include RF front end circuitry, such as antenna switching circuitry, that allows for RF signals to be routed to the various transmit chains and receiver chains from one or more common antennas. Furthermore, carrier aggregation techniques are often employed where multiple RF signals are simultaneously received or transmitted from a common antenna.

Filtering circuitry is often employed in order to route the RF signals to and/or from the appropriate RF transceiver chains. Unfortunately, the various filter circuits employed in order to route the RF signals can load one another and cause significant distortion. Thus, switching circuits are often employed in order to isolate the different filter circuits from one another. However, when the different filtering circuits are switched in and out, the reactive load seen by the antenna changes. This can result in significant insertion losses. Accordingly, RF front end circuitry is needed with switch technology that can provide isolation between filter circuits while reducing changes in the reactive load at the antenna as different filter circuits are switched in and out.

SUMMARY

This disclosure relates generally to Radio Frequency (RF) front end circuitry used to route RF signals. For example, the RF front end circuitry described herein can be utilized to route RF signals to and/or from an antenna port connected to an antenna from and/or to different RF transceiver chains. In one embodiment, the RF front end circuitry has a filter circuit and a switch device. The switch device includes a common port, an RF port, and switchable path. The switchable path is operable to be opened and closed and is connected in series between the common port and the RF port. The filter circuit is coupled to the RF port and is configured to present a filter capacitance to the RF port. The switch device is configured to present approximately the filter capacitance of the filter circuit at the common port when the switchable path is closed. However, when the switchable path is open, the switch device is configured to present a device capacitance at the common port. The device capacitance is approximately equal to the filter capacitance of the filter circuit. In this manner, a capacitance at the common port is maintained substantially unchanged regardless of whether the switchable path is opened or closed. As such, if the common port is connected to an antenna, the total capacitance seen by the antenna from the common port remains substantially unchanged regardless of which of the switchable paths is opened or closed.

Those skilled in the art will appreciate the scope of the present invention and realize additional aspects thereof after reading the following detailed description of the preferred embodiments in association with the accompanying drawing figures.

BRIEF DESCRIPTION OF THE DRAWING FIGURES

The accompanying drawing figures incorporated in and forming a part of this specification illustrate several aspects of the invention, and together with the description serve to explain the principles of the invention.

FIG. 1 is an illustration of one embodiment of radio frequency (RF) front end circuitry that includes a switch device operable to open and close switchable series paths between RF port and a common port, filtering circuitry having multiple filter circuits each coupled to a different corresponding one of the RF ports, and control circuitry, wherein the switch device includes capacitive elements operably associated with a different corresponding one of the switchable series paths so as to maintain a total capacitance at the common port substantially unchanged regardless of which of the switchable series paths is opened or closed by the control circuitry.

Figure 1:
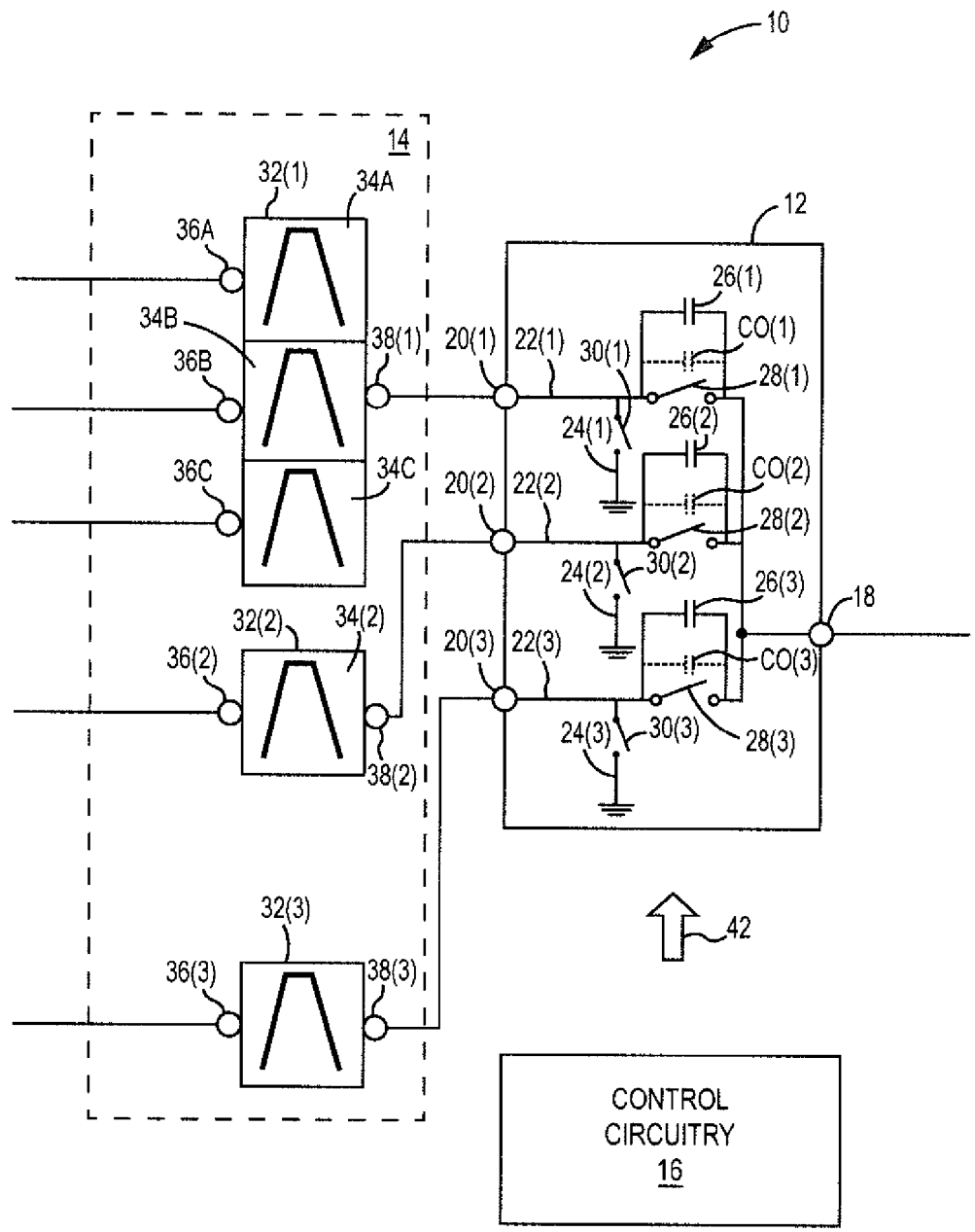
Figure 9:
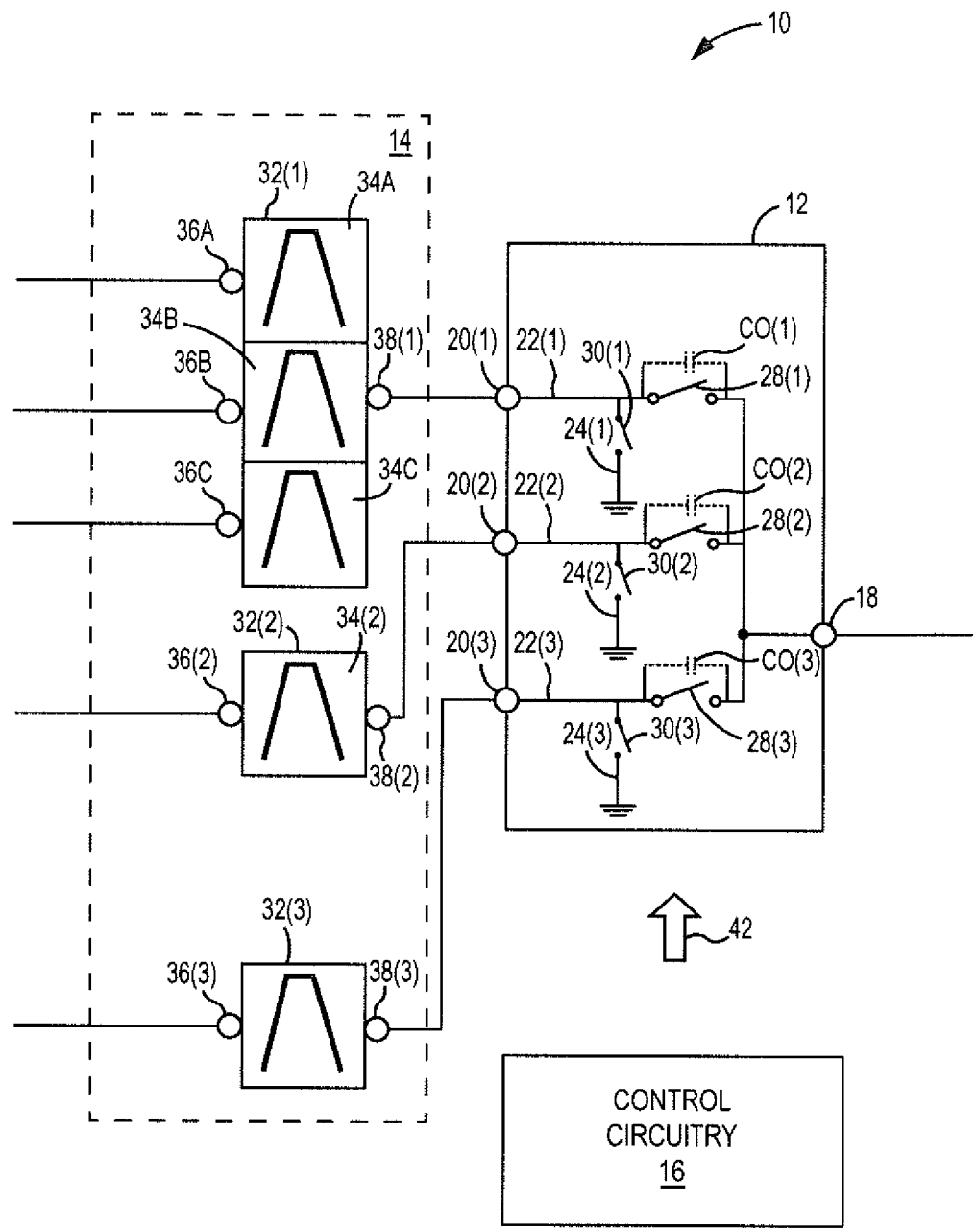
Figure 10:
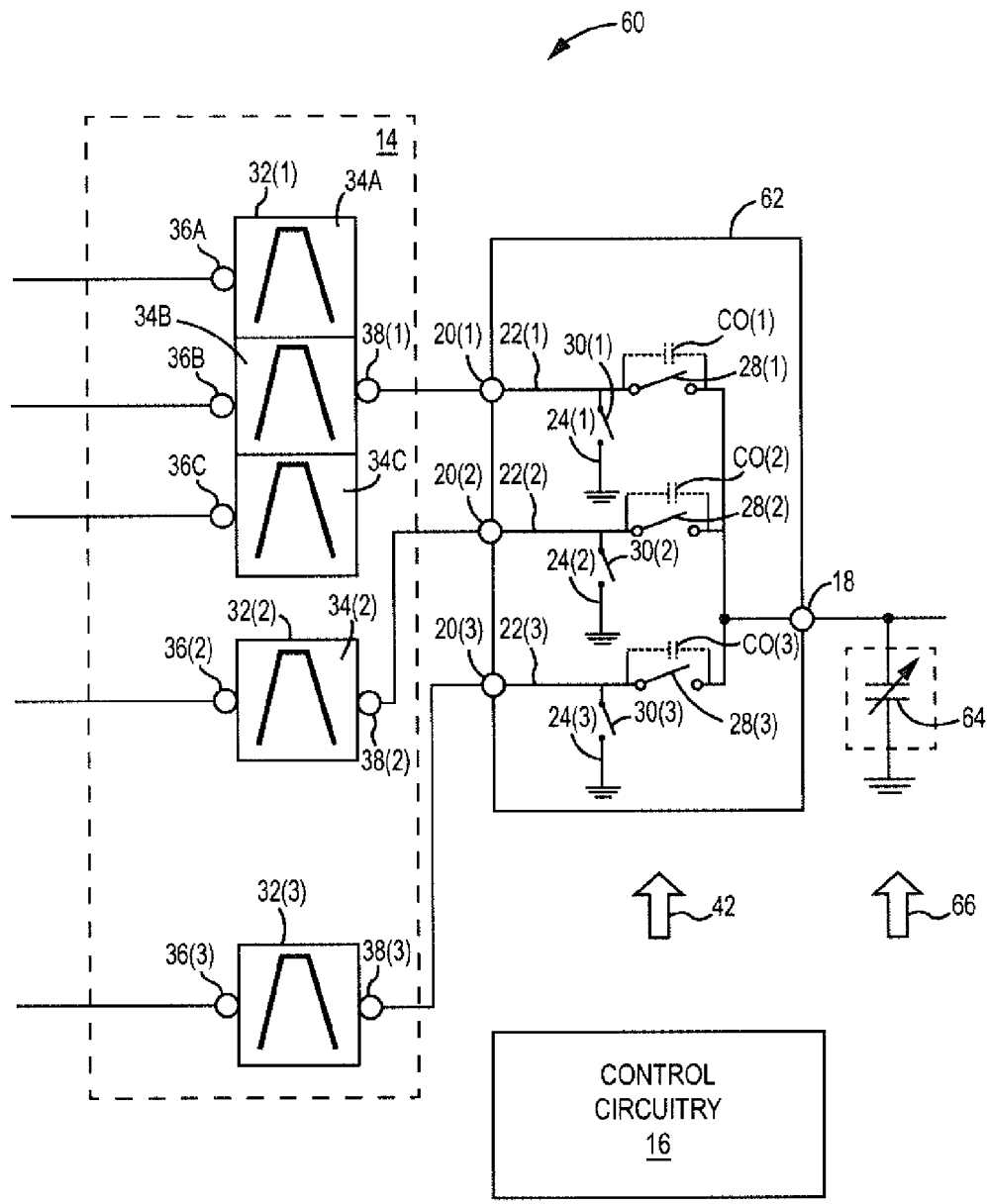

FIG. 9 illustrates another embodiment of the RF front end circuitry shown in FIG. 1 except that the embodiment shown in FIG. 9 does not include capacitive elements operably associated with a different corresponding one of the switchable series paths but rather switches in the switchable series paths are configured to provide off switch capacitances that maintain a total capacitance at the common port substantially unchanged regardless of which of the switchable series paths is opened or closed by the control circuitry FIG. 10 is an illustration of one embodiment of RF front end circuitry that includes a switch device operable to open and close switchable series paths between RF port and a common port, filtering circuitry having multiple filter circuits each coupled to a different corresponding one of the RF ports, and control circuitry, wherein the switch device, which is a variable capacitive element is connected to the common port in order to maintain a total capacitance at the common port substantially unchanged regardless of which of the switchable series paths is opened or closed by the control circuitry.

Figure 11:
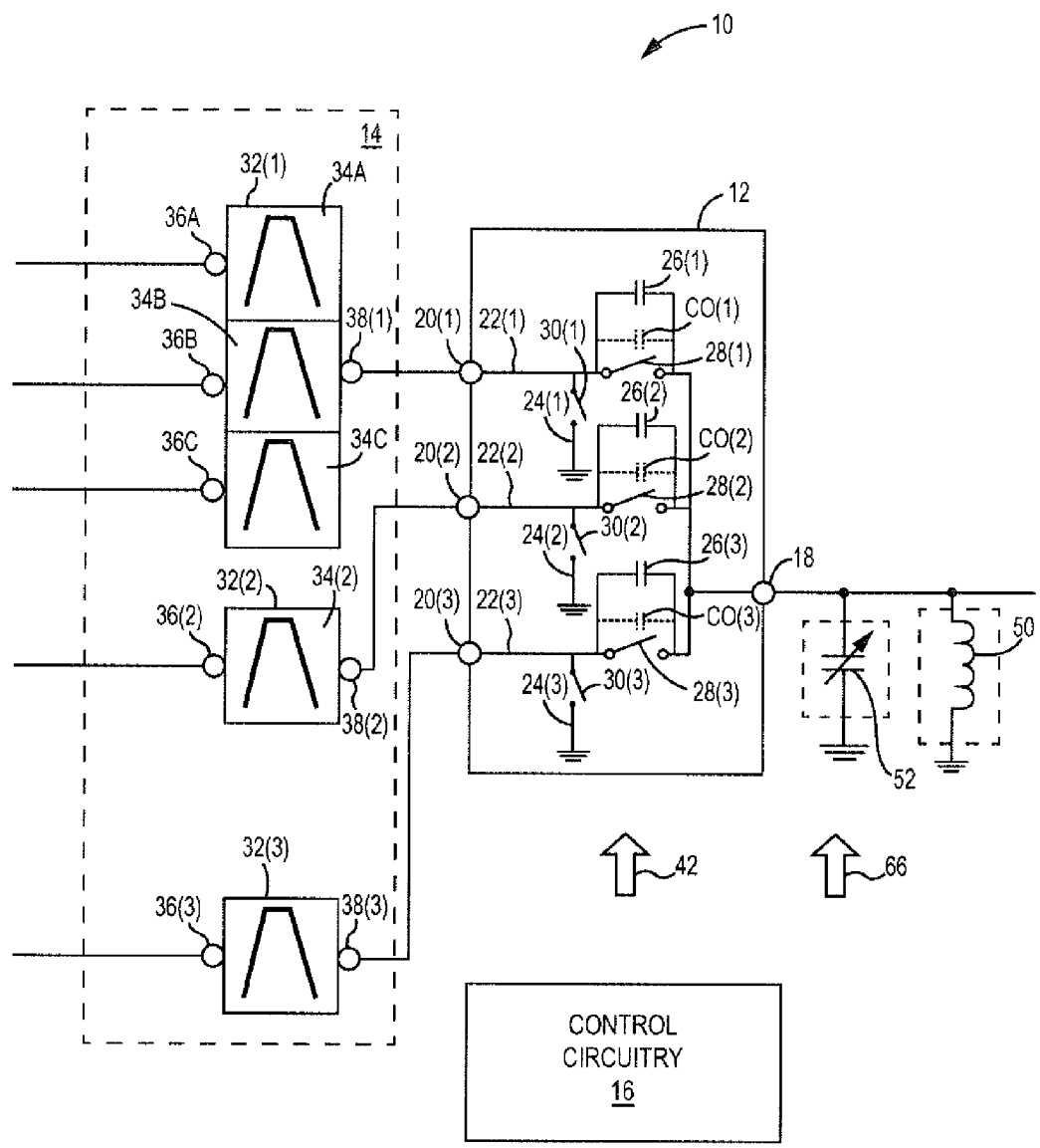

FIG. 11 is another embodiment of the RF front end circuitry shown in FIG. 10 that further includes capacitive elements operably associated with each of the switchable series paths and an inductor connected in shunt with respect to the common port of the switch device.

DETAILED DESCRIPTION OF THE PREFERRED EMBODIMENTS

The embodiments set forth below represent the necessary information to enable those skilled in the art to practice the invention and illustrate the best mode of practicing the invention. Upon reading the following description in light of the accompanying drawing figures, those skilled in the art will understand the concepts of the invention and will recognize applications of these concepts not particularly addressed herein. It should be understood that these concepts and applications fall within the scope of the disclosure and the accompanying claims.

Throughout this disclosure, relative terminology, such as "approximately," "substantially," and the like, may be used in a predicate to describe features and relationships between features of a device or method. The relative terminology in the predicate should be interpreted sensu lato. However, whether the predicate employing the relative terminology is satisfied is determined in accordance to error ranges and/or variation tolerances relevant to the predicate and prescribed to the device or method by radio frequency (RF) communication standards relevant to the RF application(s) employing the device or method. For example, the particular RF application employing the device or method may be designed to operate in accordance with certain communication standards, specifications, or the like. These communication standards and specification may prescribe the error ranges and/or variation tolerances relevant to the predicate or may describe performance parameters relevant to the predicate from which the error ranges and/or variation tolerances for the device or method can be deduced or inferred.

With regard to the term "port," a port refers to any component or set of components configured to input and/or output RF signals. To illustrate, a port may be provided as a node, pin, terminal, contact, connection pad, and/or the like or a set of the aforementioned components. For example, with regard to a single-ended signal, a port may be provided by a single node or a single terminal. However, in other embodiments for a differential signal, a port may be provided by a pair of terminals or nodes configured to receive and/or transmit differential signals.

This disclosure describes arrangements of RF front end circuitry that may be utilized to route RF signals to or from a common port while maintaining reactive loading at the common port substantially constant. For example, the common port may be coupled to an antenna port and thus may be arranged to route RF signals within different RF bands from the antenna to different RF transceiver chains or from RF transceiver chains to the antenna. The RF front end circuitry maintains the reactive loading at the common node substantially constant, and thus a return loss at the antenna port can be kept substantially unchanged, thereby allowing improvements in insertions losses.

More specifically, the RF front end circuitry may include a switch device having a common port and filtering circuitry having one or more filter circuits that are tied together to the common port through the switch device. For example, the switch device may include multiple RF ports each connected to a different corresponding filter circuit in the filtering circuitry and may include switchable series paths each connected between the common port and a corresponding one of the RF ports. Each of the filter circuits may provide a filter capacitance that is presented to the common port of the switch device when the switchable series path corresponding to the filter circuit is closed. However, when one or more of the switchable series paths are opened, the RF front end circuitry is arranged so that a total capacitance at the common port is maintained approximately unchanged. For example, in some embodiments, for each of the filter circuits, the switch device is configured to present a device capacitance approximately equal to the filter capacitance of the filter circuit when the switchable series path connected to the filter circuit is opened. As such, a total capacitance at the common port is maintained approximately unchanged regardless of which of the switchable series paths are opened and closed. In other embodiments, a variable capacitive element may be connected to the common port in order to compensate for the filter capacitances not being presented at the common port and may thereby maintain the total capacitance unchanged.

The RF front end circuitry described herein may thus be utilized in carrier aggregation systems which route RF signals within different RF frequency bands to and/or from an antenna port coupled to the common port of the switch device. By opening the switchable series paths when RF signals are not being routed through the corresponding filter circuits of the filtering circuitry, the switch device provides isolation between the different filter circuits and reduces loading. In addition, the RF front end circuitry maintains the total capacitance presented to the common port approximately unchanged. Accordingly, the total capacitance presented at the common port and to the antenna port is maintained approximately unchanged regardless of the carrier aggregation combination thereby allowing for insertion losses to be reduced.

FIG. 1 is an illustration of one embodiment of RF front end circuitry 10 that includes a switch device 12, filtering circuitry 14, and control circuitry 16. The switch device 12 may be any type of device having one or more switchable paths that are operable to be opened and closed. In this embodiment, the switch device 12 is a single pole triple throw switch device. As such, the switch device 12 includes a common port 18, a first RF port 20(1), a second RF port 20(2) and a third RF port 20(3). (The first RF port 20(1), the second RF port 20(2), and the third RF port 20(3) are referred to collectively or generically as the RF port(s) 20). Furthermore, the switch device 12 includes a first switchable series path 22(1), a second switchable series path 22(2), a third switchable series path 22(3) (referred to collectively or generically as the switchable series path(s) 22) a first switchable shunt path 24(1), a second switchable shunt path 24(2), a third switchable shunt path 24(3) (referred to collectively or generically as switchable shunt path(s) 24). Additionally, the switch device 12 includes a first capacitive element 26(1) having a first capacitance, a second capacitive element 26(2) having a second capacitance, and a third capacitive element 26(3) having a third capacitance (referred to collectively or generically as the capacitive element(s) 26). It should be noted that in alternative embodiments, the switch device 12 may be a switch device of any number of switchable paths between any number of RF ports and common ports including having a single switchable series path connected between a single common port and a single RF port. Thus, any number of the capacitive elements 26 may be provided including a single capacitive element. The capacitive elements 26 may be provided as any suitable type of capacitive element. In one embodiment, each of the capacitive elements 26 is provided as a metal-insulator-metal (MIM) capacitor, since MIM capacitors have a high quality factor while being small in size. In another embodiment, each of the capacitive elements 26 is provided as a metal-on-metal (MOM) capacitor.

Each of the switchable series paths 22 and each of the switchable shunt paths 24 are operable to be opened and closed. Each of the switchable series paths 22 is connected in series between the common port 18 and a corresponding one of the RF ports 20, and each of the switchable shunt paths 24 is connected in shunt to a corresponding one of the switchable series paths 22. More specifically, the first switchable series path 22(1) is connected in series between the common port 18 and the first RF port 20(1). In this embodiment, the first switchable series path 22(1) includes a switch 28(1) connected in series within the first switchable series path 22(1). The switch 28(1) is operable to be turned on so that the first switchable series path 22(1) is opened and is operable to be turned off so that the first switchable series path 22(1) is closed. The switch 28(1) also is operable to provide an off switch capacitance CO(1) when the switch 28(1) is turned off but is operable so as not to provide the off switch capacitance CO(1) when the switch 28(1) is turned on. Also, the first switchable shunt path 24(1) includes a switch 30(1) connected in series within the first switchable shunt path 24(1). The first switchable shunt path 24(1) is connected in shunt to the first switchable series path 22(1) between the switch 28(1) and the first RF port 20(1). The switch 30(1) is operable to be turned on so that the first switchable shunt path 24(1) is opened and is operable to be turned off so that the first switchable shunt path 24(1) is closed.

Next, the second switchable series path 22(2) is connected in series between the common port 18 and the second RF port 20(2). In this embodiment, the second switchable series path 22(2) includes a switch 28(2) connected in series within the second switchable series path 22(2). The switch 28(2) is operable to be turned on so that the second switchable series path 22(2) is opened and is operable to be turned off so that the second switchable series path 22(2) is closed. The switch 28(2) also is operable to provide an off switch capacitance CO(2) when the switch 28(2) is turned off but is operable so as not to provide the off switch capacitance CO(2) when the switch 28(2) is turned on. Also, the second switchable shunt path 24(2) includes a switch 30(2) connected in series within the second switchable shunt path 24(2). The second switchable shunt path 24(2) is connected in shunt to the second switchable series path 22(2) between the switch 28(2) and the second RF port 20(2). The switch 30(2) is operable to be turned on so that the second switchable shunt path 24(2) is opened and is operable to be turned off so that the second switchable shunt path 24(2) is closed.

Finally, the third switchable series path 22(3) is connected in series between the common port 18 and the third RF port 20(3). In this embodiment, the third switchable series path 22(3) includes a switch 28(3) connected in series within the third switchable series path 22(3). The switch 28(3) is operable to be turned on so that the third switchable series path 22(3) is opened and is operable to be turned off so that the third switchable series path 22(3) is closed. The switch 28(3) also is operable to provide an off switch capacitance CO(3) when the switch 28(3) is turned off but is operable so as not to provide the off switch capacitance CO(3) when the switch 28(3) is turned on. Also, the third switchable shunt path 24(3) includes a switch 30(3) connected in series within the third switchable shunt path 24(3). The third switchable shunt path 24(3) is connected in shunt to the third switchable series path 22(3) between the switch 28(3) and the third RF port 20(3). The switch 30(3) is operable to be turned on so that the third switchable shunt path 24(3) is opened and is operable to be turned off so that the third switchable shunt path 24(3) is closed. (The switch 28(1), the switch 28(2), and the switch 28(3) are referred to collectively or generically as switch(es) 28; the switch 30(1), the switch 30(2), and the switch 30(3) are referred to generically as the switch(es) 30; and the off switch capacitance CO(1), the off switch capacitance CO(2), and the off switch capacitance CO(3) are referred to generically or specifically as the off switch capacitance(s) CO).

The switches 28 and the switches 30 may each be provided as any suitable type of switch. For example, the switches 28 and the switches 30 may each be provided as a field effect transistor (FET), a microelectromechanical switch (MEMS), or a pseudomorphic high electron mobility transistor (pHEMT). Substrate configurations that may be used to form the switches 28, 30 include complementary metal oxide semiconductor (CMOS), silicon-on-insulator (SOI), and silicon-on-sapphire (SOS).

With regard to the filtering circuitry 14, the filtering circuitry 14 includes a first filter circuit 32(1), a second filter circuit 32(2), and a third filter circuit 32(3) (referred to generically or specifically as the filter circuit(s) 32). The filtering circuitry 14 shown in FIG. 1 thus has more than one of the filter circuits 32 where the filter circuits 32 are provided so that each provides a different RF passband, and thus each of the filter circuits 32 is configured to pass RF signals within different RF bands. Accordingly, the filtering circuitry 14 provides a multiplexing function through filtering. It should be noted that while the filtering circuitry 14 shown in FIG. 1 has three of the filter circuits 32 and thus provides a triplexing type functionality, other embodiments of the filtering circuitry 14 may have any number of one or more of the filter circuits 32. For example, when more than one of the filter circuits (e.g., like the filter circuits 32 shown in FIG. 1) are provided, alternative embodiments of the filtering circuitry 14 can provide diplexing, quadriplexing, quintplexing, hexplexing, septiplexing, or octoplexing arrangements.

The filter circuits 32 of the filtering circuitry 14 are tied together to the common port 18 of the switch device 12 through a corresponding one of the switchable series paths 22. Thus, the switch device 12 is configured to switch the filter circuits 32 in or out depending on the RF bands of the RF signals that are being routed through the RF front end circuitry 10. Thus, the switch device 12 can isolate the filter circuits 32 from one another by opening the switchable series paths 22 corresponding to the filter circuits 32 that are not being utilized to pass RF signals. The switch device 12 thus can reduce insertion losses and increase isolation between the filter circuits 32 of the filtering circuitry 14. As explained in further detail below, the filtering circuitry 14 and the switch device 12 are operably associated so that the reactive loading at the common port 18 is maintained approximately unchanged regardless of which of the filter circuits 32 are switched in or out by the switch device 12.

With regard to the filter circuit 32(1) of the filtering circuitry 14, the first filter circuit 32(1) is a multiplexer that includes a plurality of filters 34A, 34B, 34C (referred to collectively or generically as filter(s) 34(1)), RF ports 36A, 36B, 36C (referred to collectively or generically as RF port(s) 36(1)) and a common port 38(1). In this specific embodiment, the first filter circuit 32(1) is a triplexer and thus includes three filters, mainly, the filter 34A, the filter 34B, and the filter 34C and three RF ports 36A, 36B, 36C. However, it should be noted that in alternative embodiments, the first filter circuit 32(1) or any of the other filter circuits 32(2), 32(3) may include any number of filters and RF ports. Each of the RF ports 36 is connected to a different corresponding one of the plurality of filters 34, and each of the plurality of filters 34 is connected to the common port 38(1). As such, the filter 34A is connected between the common port 38(1) and the RF port 36A. The filter 34A is configured to provide an RF passband so that RF signals within the RF passband are passed through the filter 34A to and/or from the common port 38(1) from and/or to the RF port 36A. The filter 34B is connected between the common port 38(1) and the RF port 36B. The filter 34B is configured to provide an RF passband so that RF signals within the RF passband are passed through the filter 34B to and/or from the common port 38(1) from and/or to the RF port 36B. The filter 34C is connected between the common port 38(1) and the RF port 36C. The filter 34C is configured to provide an RF passband so that RF signals within the RF passband are passed through the filter 34C to and/or from the common port 38(1) from and/or to the RF port 36C.

The first filter circuit 32(1), which in this example is a multiplexer, is configured to present a first filter capacitance at the common port 38(1). Since the first filter circuit 32(1) is a multiplexer (more specifically in this example a triplexer), the first filter capacitance is provided as a network capacitance at the common port 38(1) of the combination of the plurality of filters 34 of the first filter circuit 32(1). The common port 38(1) of the first filter circuit 32(1) is coupled to the first RF port 20(1) of the switch device 12. In this manner, the first filter capacitance is presented at the first RF port 20(1) of the switch device 12.

The switch device 12 is configured to present approximately the first filter capacitance of the first filter circuit 32(1) at the common port 18 of the switch device 12 when the first switchable series path 22(1) is closed and when the first switchable shunt path 24(1) is open. However, the switch device 12 is configured to present approximately a first device capacitance at the common port when the first switchable series path 22(1) is open at the common port 18 of the switch device 12 when the first switchable series path 22(1) is closed and when the first switchable shunt path 24(1) is open. Accordingly, when the first switchable series path 22(1) is open and when the first switchable shunt path 24(1) is closed, the first device capacitance (presented by the switch device 12 at the common port 18 of the switch device 12) is approximately equal to a combination of the first capacitance provided by the first capacitive element 26(1) and the off switch capacitance CO(1) of the switch 28(1). As shown in FIG. 1, the first capacitive element 26(1) is connected in parallel with the switch 28(1). Since the first switchable shunt path 24(1) is closed, the first device capacitance is provided as a parallel equivalent capacitance of the off switch capacitance CO(1) and the first capacitance of the first capacitive element 26(1). The first device capacitance of the switch device 12 approximately equals the first filter capacitance of the first filter circuit 32(1). In this manner, regardless of whether the first switchable series path 22(1) is opened and the first switchable series path is closed or the first switchable series path 22(1) is closed and the first switchable series path is opened, a capacitance presented at the common port 18 of the switch device 12 from the first switchable series path 22(1) is maintained approximately the same.

The second filter circuit 32(2) includes a filter 34(2), an RF port 36(2), and a common port 38(2). In this specific embodiment, the second filter circuit 32(2) thus includes a single filter (i.e., the filter 34(2)). The RF port 36(2) is connected to the filters 34(2), and the filter 34(2) is connected to the common port 38(2). As such, the filter 34(2) is connected between the common port 38(2) and the RF port 36(2). The filter 34(2) is configured to provide an RF passband so that RF signals within the RF passband are passed through the filter 34(2) to and/or from the common port 38(2) from and/or to the RF port 36(2).

Furthermore, the second filter circuit 32(2), which in this example is provided as the single filter 34(2), is configured to present a second filter capacitance at the common port 38(2). Since the second filter circuit 32(2) only has the single filter 34(2), the second filter capacitance is provided as a filter capacitance of the filter 34(2) at the common port 38(2). The common port 38(2) of the second filter circuit 32(2) is coupled to the second RF port 20(2) of the switch device 12. In this manner, the second filter capacitance is presented at the second RF port 20(2) of the switch device 12.

The switch device 12 is configured to present approximately the second filter capacitance of the second filter circuit 32(2) at the common port 18 of the switch device 12 when the second switchable series path 22(2) is closed and when the second switchable shunt path 24(2) is open. However, the switch device 12 is configured to present approximately a second device capacitance at the common port when the second switchable series path 22(2) is open at the common port 18 of the switch device 12 when the second switchable series path 22(2) is closed and when the second switchable shunt path 24(2) is open. Accordingly, when the second switchable series path 22(2) is open and when the second switchable shunt path 24(2) is closed, the second device capacitance (presented by the switch device 12 at the common port 18 of the switch device 12) is approximately equal to a combination of the second capacitance provided by the second capacitive element 26(2) and the off switch capacitance CO(2) of the switch 28(2). As shown in FIG. 1, the second capacitive element 26(2) is connected in parallel with the switch 28(2). Since the second switchable shunt path 24(2) is closed, the second device capacitance is provided as a parallel equivalent capacitance of the off switch capacitance CO(2) and the second capacitance of the second capacitive element 26(2). The second device capacitance of the switch device 12 approximately equals the second filter capacitance of the second filter circuit 32(2). In this manner, regardless of whether the second switchable series path 22(2) is opened and the second switchable series path is closed or the second switchable series path 22(2) is closed and the second switchable series path is opened, a capacitance presented at the common port 18 of the switch device 12 from the second switchable series path 22(2) is maintained approximately the same.

The third filter circuit 32(3) includes a filter 34(3), an RF port 36(3), and a common port 38(3). In this specific embodiment, the third filter circuit 32(3) thus includes a single filter (i.e., the filter 34(3)). The RF port 36(3) is connected to the filters 34(3), and the filter 34(3) is connected to the common port 38(3). As such, the filter 34(3) is connected between the common port 38(3) and the RF port 36(3). The filter 34(3) is configured to provide an RF passband so that RF signals within the RF passband are passed through the RF filter 34(3) to and/or from the common port 38(3) from and/or to the RF port 36(3).

Furthermore, the third filter circuit 32(3), which in this example is provided as the single filter 34(3), is configured to present a third filter capacitance at the common port 38(3). Since the third filter circuit 32(3) only has the single filter 34(3), the third filter capacitance is provided as a filter capacitance of the filter 34(3) at the common port 38(3). The common port 38(3) of the third filter circuit 32(3) is coupled to the third RF port 20(3) of the switch device 12. In this manner, the third filter capacitance is presented at the third RF port 20(3) of the switch device 12.

The switch device 12 is configured to present approximately the third filter capacitance of the third filter circuit 32(3) at the common port 18 of the switch device 12 when the third switchable series path 22(3) is closed and when the third switchable shunt path 24(3) is open. However, the switch device 12 is configured to present approximately a third device capacitance at the common port when the third switchable series path 22(3) is open at the common port 18 of the switch device 12 when the third switchable series path 22(3) is closed and when the third switchable shunt path 24(3) is open. Accordingly, when the third switchable series path 22(3) is open and when the third switchable shunt path 24(3) is closed, the third device capacitance (presented by the switch device 12 at the common port 18 of the switch device 12) is approximately equal to a combination of the third capacitance provided by the third capacitive element 26(3) and the off switch capacitance CO(3) of the switch 28(3). As shown in FIG. 1, the third capacitive element 26(3) is connected in parallel with the switch 28(3). Since the third switchable shunt path 24(3) is closed, the third device capacitance is provided as a parallel equivalent capacitance of the off switch capacitance CO(3) and the third capacitance of the third capacitive element 26(3). The third device capacitance of the switch device 12 approximately equals the third filter capacitance of the third filter circuit 32(3). In this manner, regardless of whether the third switchable series path 22(3) is opened and the third switchable series path is closed or the third switchable series path 22(3) is closed and the third switchable series path is opened, a capacitance presented at the common port 18 of the switch device 12 from the third switchable series path 22(3) is maintained approximately the same.

Since the switch device 12 in this embodiment has more than one of the RF ports 20 and thus more than one of the switchable series paths 22 and more than one of the switchable shunt paths 24, a total capacitance presented at the common port 18 is provided from the combination of the switchable series paths 22. However, the total capacitance presented at the common port 18 is maintained approximately unchanged regardless of which combination of the switchable series paths 22 and the associated switchable shunts paths 24 is selected to be opened/closed or closed/opened. This is because the first filter capacitance and the first device capacitance are approximately the same, the second filter capacitance and the second device capacitance are approximately the same, and the third filter capacitance and the third device capacitance are approximately the same.

The control circuitry 16 is configured to open and close the switchable series paths 22 and the switchable shunt paths 24 by turning off and turning on the switches 28 and the switches 30. The control circuitry 16 is configured to operate the switch device 12 so that when one of the switchable series paths 22 is closed, the corresponding switchable shunt path 24 is opened, and when one of the switchable series paths 22 is opened, the corresponding switchable shunt path 24 is opened.

As such, the control circuitry 16 operates the switch 28(1) and the switch 30(1) in association with one another. Thus, with respect to the first switchable series path 22(1) and the first switchable shunt path 24(1), the control circuitry 16 is configured to operate the switch device 12 such that any one of a first group of actions can be selected by the control circuitry 16. One of the actions in the first group of actions is turning on the switch 28(1) to close the first switchable series path 22(1) and turning off the switch 30(1) to open the first switchable shunt path 24(1) so that the switch device 12 presents approximately the first filter capacitance of the first filter circuit 32(1) at the common port 18. Another one of the actions in the first group of actions is turning off the switch 28(1) to open the first switchable series path 22(1) and turning on the switch 30(1) to close the first switchable shunt path 24(1) so that the switch device 12 presents approximately the first device capacitance (i.e., the combination of the first capacitance of the first capacitive element 26(1) and the off switch capacitance CO(1) in FIG. 1) at the common port 18.

Furthermore, the control circuitry 16 operates the switch 28(2) and the switch 30(2) in association with one another. Thus, with respect to the second switchable series path 22(2) and the second switchable shunt path 24(2), the control circuitry 16 is configured to operate the switch device 12 such that any one of a second group of actions can be selected by the control circuitry 16. One of the actions in the second group of actions is turning on the switch 28(2) to close the second switchable series path 22(2) and turning off the switch 30(2) to open the second switchable shunt path 24(2) so that the switch device 12 presents approximately the second filter capacitance of the second filter circuit 32(2) at the common port 18. Another one of the actions in the second group of actions is turning off the switch 28(2) to open the second switchable series path 22(2) and turning on the switch 30(2) to close the second switchable shunt path 24(2) so that the switch device 12 presents approximately the second device capacitance (i.e., the combination of the second capacitance of the second capacitive element 26(2) and the off switch capacitance CO(2) in FIG. 1) at the common port 18.

Additionally, the control circuitry 16 operates the switch 28(3) and the switch 30(3) in association with one another. Thus, with respect to the third switchable series path 22(3) and the third switchable shunt path 24(3), the control circuitry 16 is configured to operate the switch device 12 such that any one of a third group of actions can be selected by the control circuitry 16. One of the actions in the third group of actions is turning on the switch 28(3) to close the third switchable series path 22(3) and turning off the switch 30(3) to open the third switchable shunt path 24(3) so that the switch device 12 presents approximately the third filter capacitance of the third filter circuit 32(3) at the common port 18. Another one of the actions in the third group of actions is turning off the switch 28(3) to open the third switchable series path 22(3) and turning on the switch 30(3) to close the third switchable shunt path 24(3) so that the switch device 12 presents approximately the third device capacitance (i.e., the combination of the third capacitance of the third capacitive element 26(3) and the off switch capacitance CO(3) in FIG. 1) at the common port 18.

As mentioned above, the first filter capacitance is approximately equal to the first device capacitance, the second filter capacitance is approximately equal to the second device capacitance, and the third filter capacitance is approximately equal to the third device capacitance. Accordingly, the switch device 12 is configured such that the total capacitance presented at the common port 18 is approximately unchanged for any selection by the control circuitry 16 from the first group of actions, the second group of actions, and the third group of actions.

In this embodiment, the control circuitry 16 is configured to generate a switch control output 42. The switch device 12 is configured to receive the switch control output 42 and is responsive to the switch control output 42 so as to open and close the switches 28 and the switches 30. More specifically, the switch control output 42 may have different permutations depending on which combination of the switchable series paths 22 and the switchable shunt paths 24 is configured to be opened and closed. Thus, in accordance with the permutation of the switch control output 42, the appropriate combination of one or more of the switchable series paths 22 is opened and the appropriate combination of the switchable series paths 24 is closed so that RF signals can be routed from the common port 18 to the appropriate common port(s) 38(1), 38(2), 38(3) of the filtering circuitry 14. In this manner, the control circuitry 16 can open/close or close/open any combination of the switches 28 and switches 30.

Figure 2:
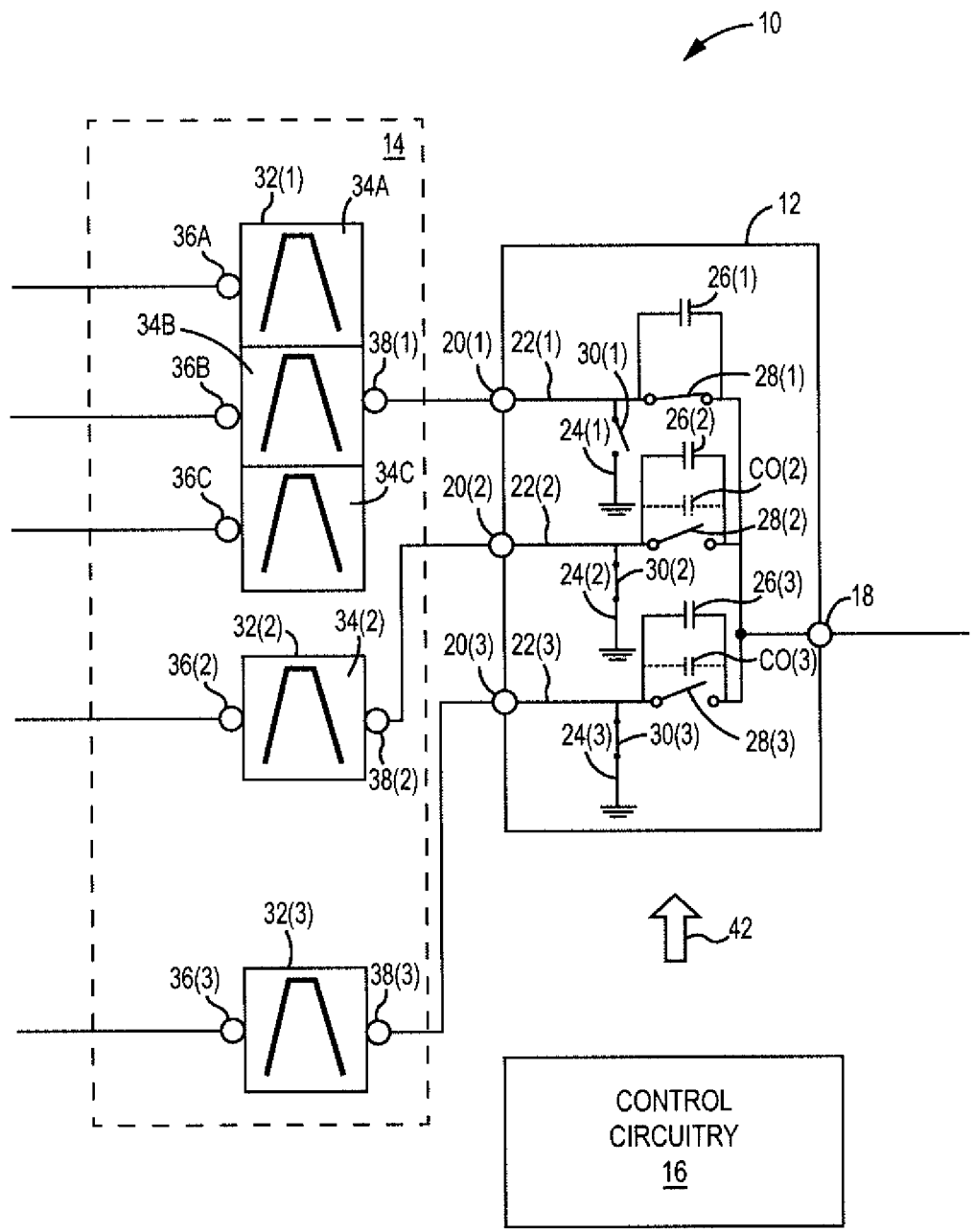
FIG. 2 illustrates the RF front end circuitry shown in FIG. 1 when the control circuitry has closed a first switchable series path and has opened the other switchable series paths of the switch device.
Figure 3:
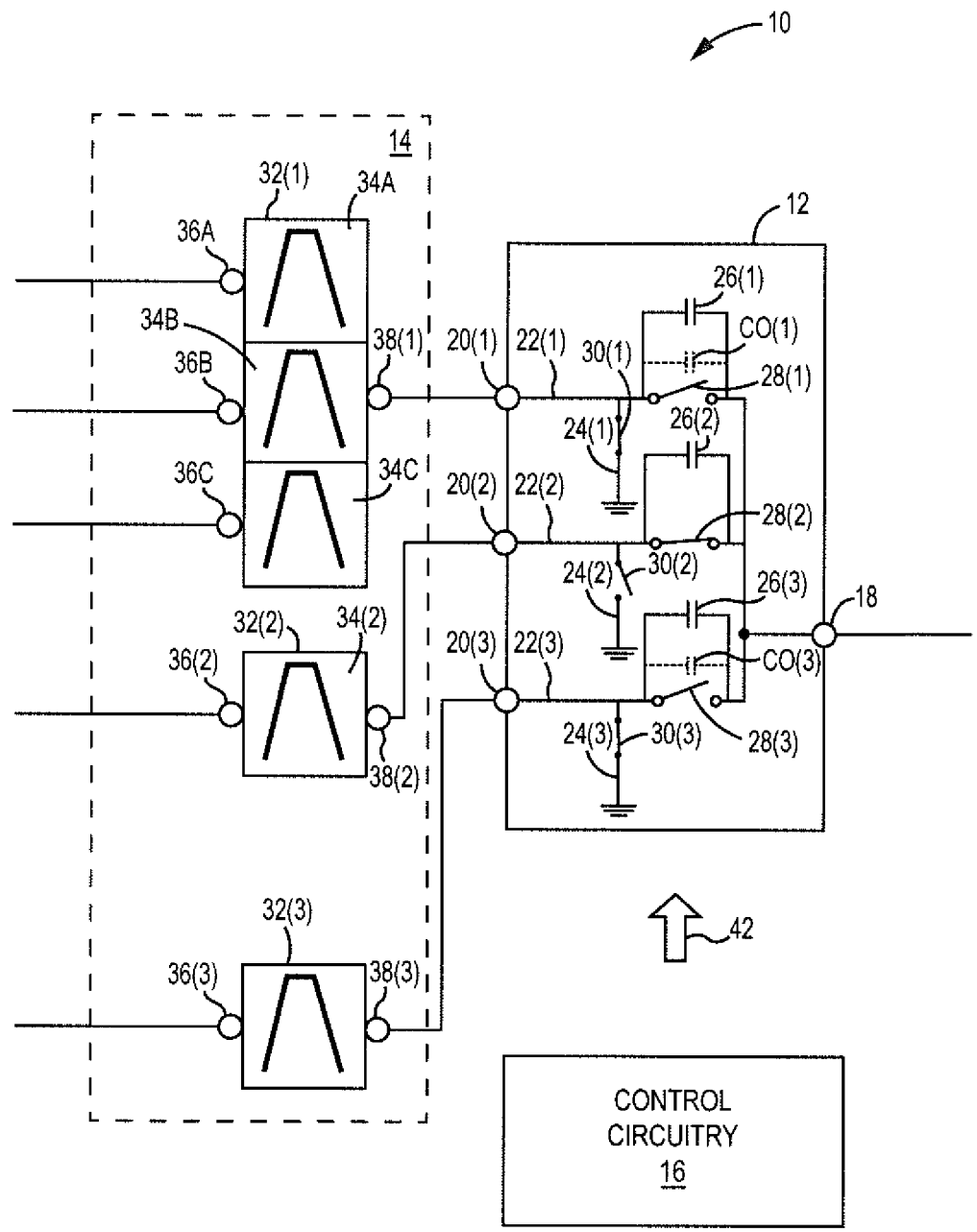
FIG. 3 illustrates the RF front end circuitry shown in FIG. 1 when the control circuitry has closed a second switchable series path and has opened the other switchable series paths of the switch device.
Figure 4:
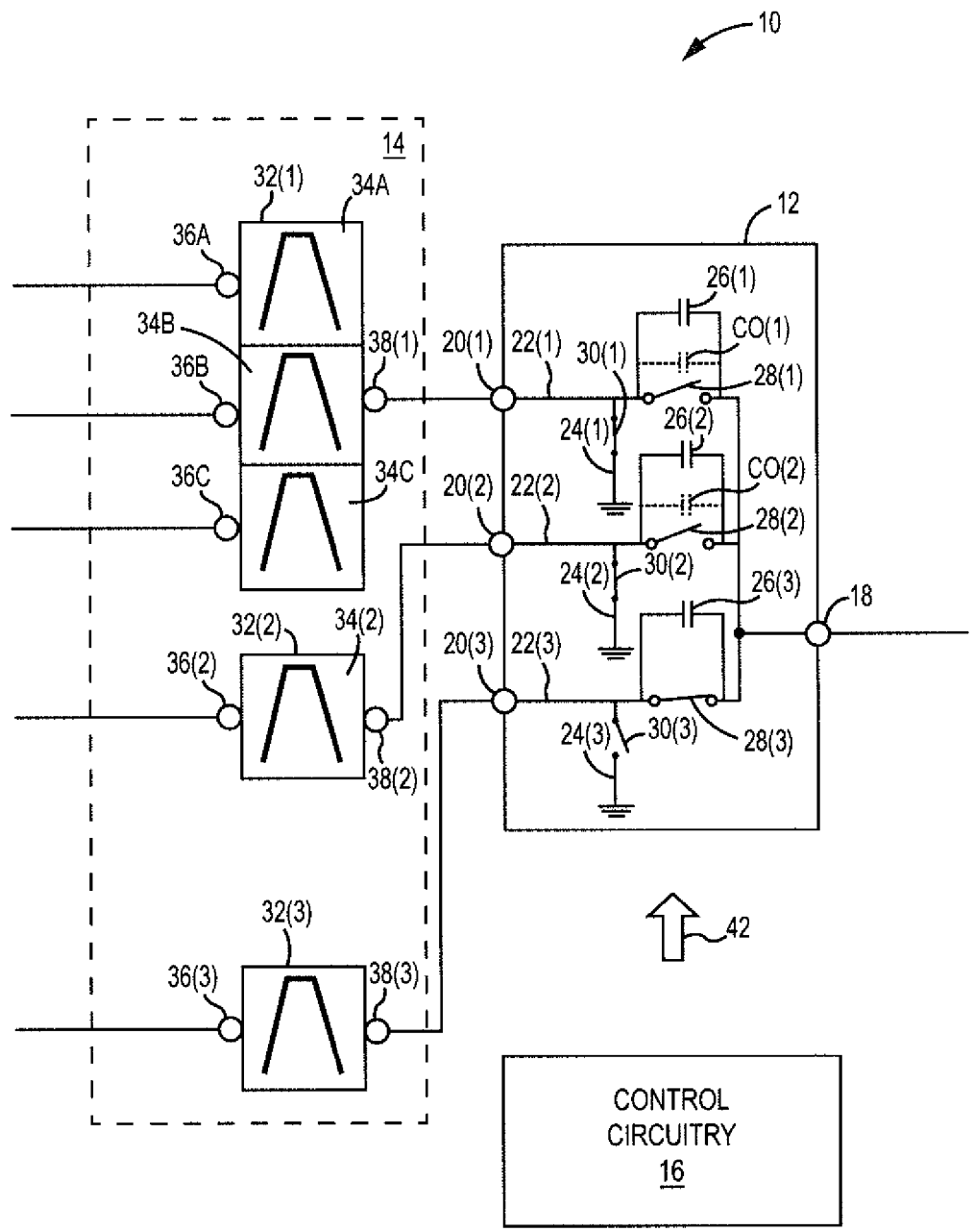
FIG. 4 illustrates the RF front end circuitry shown in FIG. 1 when the control circuitry has closed a third switchable series path and has opened the other switchable series paths of the switch device.
Figure 5:
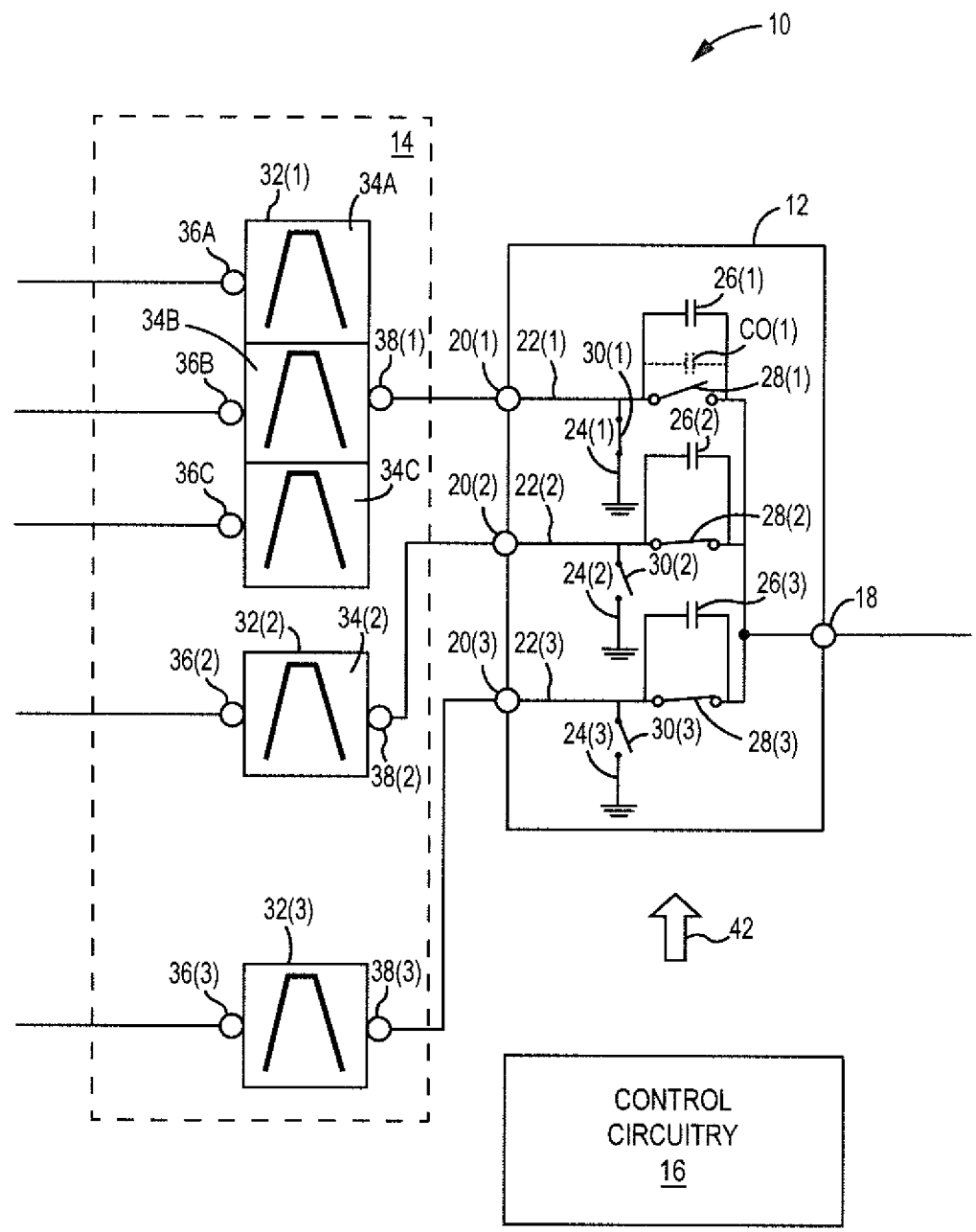
FIG. 5 illustrates the RF front end circuitry shown in FIG. 1 when the control circuitry has closed a second switchable series path and the third switchable series path while the third switchable series path is opened.
Figure 6:
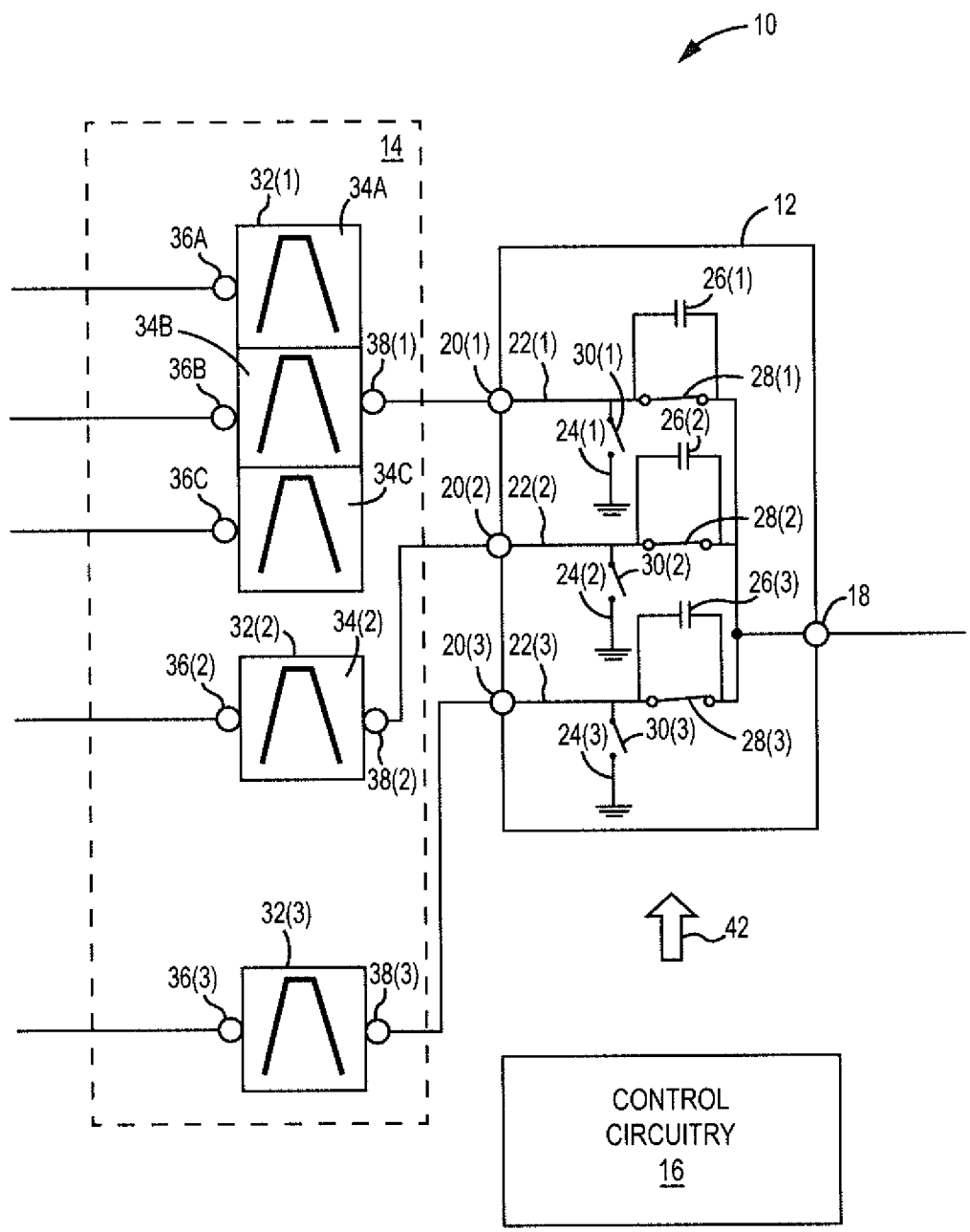
FIG. 6 illustrates the RF front end circuitry shown in FIG. 1 when the control circuitry has closed all of the switchable series paths.

FIGS. 2-6 illustrate the RF front end circuitry 10 where the control circuitry 16 has opened and closed different combinations of the switchable series paths 22 and the switchable shunt paths 24 of the switch device 12. The control circuitry 16 is configured to provide the permutations of the switch control output 42 so that when one of the switchable series paths 22 is closed, the corresponding switchable shunt path 24 is opened. On the other hand, the permutations of the switch control output 42 are provided so that when one of the switchable series paths 22 is opened, the corresponding switchable shunt path 24 is closed. FIGS. 2-4 illustrate the RF front end circuitry 10 set by the control circuitry 16 so that only one of the switchable series paths 22 is closed and only one of the corresponding switchable shunt paths 24 is open. Thus, as explained in further detail below, routing is provided by the switch device 12 from the common port 18 to only one of the filter circuits 32. FIGS. 5-6 illustrate the RF front end circuitry 10 set by the control circuitry 16 so that more than one of the switchable series paths 22 is closed and more than one of the corresponding switchable shunt path 24 is open. Note that FIGS. 2-6 are simply illustrative, and the control circuitry 16 can provide permutations of the switch control output 42 so that any combination of the switchable series paths 22 is either closed or opened with the corresponding switchable shunt paths 24 oppositely opened or closed including combinations not shown in FIGS. 2-6 for the sake of brevity.

FIG. 2 illustrates the RF front end circuitry 10 shown in FIG. 1 with the switch device 12 set to route RF signals to the first filter circuit 32(1). In FIG. 2, the control circuitry 16 has provided a permutation of the switch control output 42 to the switch device 12 that indicates that the first switchable series path 22(1) should be closed while the first switchable shunt path 24(1) should be open, the second switchable series path 22(2) should be open while the second switchable shunt path 24(2) should be closed, and the third switchable series path 22(3) should be open while the third switchable shunt path 24(3) should be closed. The switch device 12 responds in accordance with the permutation of the switch control output 42 so that the first switchable series path 22(1) is closed while the first switchable shunt path 24(1) is open, the second switchable series path 22(2) is open while the second switchable shunt path 24(2) is closed, and the third switchable series path 22(3) is open while the third switchable shunt path 24(3) is closed.

More specifically, as shown in FIG. 2, the control circuitry 16 is configured to turn on the switch 28(1) to close the first switchable series path 22(1) and turn off the switch 30(1) to open the first switchable shunt path 24(1), turn off the switch 28(2) to open the second switchable series path 22(2) and turn on the switch 30(2) to close the second switchable shunt path 24(2), and turn off the switch 28(3) to open the third switchable series path 22(3) and turn on the switch 30(3) to close the third switchable shunt path 24(3). Thus, the switch device 12 presents the first filter capacitance of the first filter circuit 32(1) at the common port 18 and does not present the first device capacitance at the common port 18, the switch device 12 does not present the second filter capacitance of the second filter circuit 32(2) at the common port 18 and does present the second device capacitance at the common port 18, and the switch device 12 does not present the third filter capacitance of the third filter circuit 32(3) at the common port 18 and does present the third device capacitance at the common port 18. Note that the off switch capacitance CO(1) (shown in FIG. 1) is not provided since the switch 28(1) is turned on while the off switch capacitance CO(2) and the off switch capacitance CO(3) are provided since the switch 28(2) and the switch 28(3) are turned off. The second filter capacitance of the second filter circuit 32(2) at the common port 18 and the third filter capacitance of the third filter circuit 32(3) are not presented at the common port 18 of the switch device 12 because the switch 30(2) and the switch 30(3) are turned off. Accordingly, the switch device 12, as shown in FIG. 2, is provided to present the first filter capacitance of the first filter circuit 32(1) at the common port 18 since the off switch capacitance CO(1) is not provided when the switch 28(1) is turned on, since the first capacitance of the first capacitive element 26(1) is shorted by the closing of the switch 28(1). The second device capacitance (i.e., the combination of the second capacitance of the second capacitive element 26(2) and the off switch capacitance CO(2)) is presented at the common port 18 since the switch 28(2) is turned off. The second filter capacitance of the second filter circuit 32(2) is not presented at the common port 18 because the switch 30(2) is turned on thereby shorting the second filter capacitance to ground. The third device capacitance (i.e., the combination of the third capacitance of the third capacitive element 26(3) and the off switch capacitance CO(3)) is presented at the common port 18 since the switch 28(3) is turned off. The third filter capacitance of the third filter circuit 32(3) is not presented at the common port 18 because the switch 30(3) is turned on thereby shorting the third filter capacitance to ground. Accordingly, the total capacitance presented at the common port 18 of the switch device 12 is the combination of the first filter capacitance, the second device capacitance, and the third device capacitance.

RF signals within the RF bands of the filters 34A, 34B, and 34C can thus pass to or from the common port 18 of the switch device 12 from or to the RF ports 36A, 36B, 36C of the first filter circuit 32(1).

FIG. 3 illustrates the RF front end circuitry 10 shown in FIG. 1 with the switch device 12 set to route RF signals to the second filter circuit 32(2). In FIG. 3, the control circuitry 16 has provided a permutation of the switch control output 42 to the switch device 12 that indicates that the second switchable series path 22(2) should be closed while the second switchable shunt path 24(2) should be open, the first switchable series path 22(1) should be open while the first switchable shunt path 24(1) should be closed, and the third switchable series path 22(3) should be open while the third switchable shunt path 24(3) should be closed. The switch device 12 responds in accordance with the permutation of the switch control output 42 so that the second switchable series path 22(2) is closed while the second switchable shunt path 24(2) is open, the first switchable series path 22(1) is open while the first switchable shunt path 24(1) is closed, and the third switchable series path 22(3) is open while the third switchable shunt path 24(3) is closed.

More specifically, as shown in FIG. 3, the control circuitry 16 is configured to turn on the switch 28(2) to close the second switchable series path 22(2) and turn off the switch 30(2) to open the second switchable shunt path 24(2), turn off the switch 28(1) to open the first switchable series path 22(1) and turn on the switch 30(1) to close the first switchable shunt path 24(1), and turn off the switch 28(3) to open the third switchable series path 22(3) and turn on the switch 30(3) to close the third switchable shunt path 24(3). Thus, the switch device 12 presents the second filter capacitance of the second filter circuit 32(2) at the common port 18 and does not present the second device capacitance at the common port 18, the switch device 12 does not present the first filter capacitance of the first filter circuit 32(1) at the common port 18 and does present the first device capacitance at the common port 18, and the switch device 12 does not present the third filter capacitance of the third filter circuit 32(3) at the common port 18 and does present the third device capacitance at the common port 18. Note that the off switch capacitance CO(2) (shown in FIG. 1) is not provided since the switch 28(2) is turned on while the off switch capacitance CO(1) and the off switch capacitance CO(3) are provided since the switch 28(1) and the switch 28(3) are turned off. The first filter capacitance of the first filter circuit 32(1) at the common port 18 and the third filter capacitance of the third filter circuit 32(3) are not presented at the common port 18 of the switch device 12 because the switch 30(1) and the switch 30(3) are turned off. Accordingly, the switch device 12, as shown in FIG. 3, is provided to present the second filter capacitance of the second filter circuit 32(2) at the common port 18 since the off switch capacitance CO(2) is not provided when the switch 28(2) is turned on and since the second capacitance of the second capacitive element 26(2) is shorted by the closing of the switch 28(2). The first device capacitance (i.e., the combination of the first capacitance of the first capacitive element 26(1) and the off switch capacitance CO(1)) is presented at the common port 18 since the switch 28(1) is turned off. The first filter capacitance of the first filter circuit 32(1) is not presented at the common port 18 because the switch 30(1) is turned on thereby shorting the first filter capacitance to ground. The third device capacitance (i.e., the combination of the third capacitance of the third capacitive element 26(3) and the off switch capacitance CO(3)) is presented at the common port 18 since the switch 28(3) is turned off. The third filter capacitance of the third filter circuit 32(3) is not presented at the common port 18 because the switch 30(3) is turned on thereby shorting the third filter capacitance to ground. Accordingly, the total capacitance presented at the common port 18 of the switch device 12 is the combination of the second filter capacitance, the first device capacitance, and the third device capacitance.

RF signals within the RF bands of the filter 34(2) can thus pass to or from the common port 18 of the switch device 12 from or to the RF port 36(2) of the second filter circuit 32(2).

FIG. 4 illustrates the RF front end circuitry 10 shown in FIG. 1 with the switch device 12 set to route RF signals to the third filter circuit 32(3). In FIG. 4, the control circuitry 16 has provided a permutation of the switch control output 42 to the switch device 12 that indicates that the third switchable series path 22(3) should be closed while the third switchable shunt path 24(3) should be open, the first switchable series path 22(1) should be open while the first switchable shunt path 24(1) should be closed, and the second switchable series path 22(2) should be open while the second switchable shunt path 24(2) should be closed. The switch device 12 responds in accordance with the permutation of the switch control output 42 so that the third switchable series path 22(3) is closed while the third switchable shunt path 24(3) is open, the first switchable series path 22(1) is open while the first switchable shunt path 24(1) is closed, and the second switchable series path 22(2) is open while the second switchable shunt path 24(2) is closed.

More specifically, as shown in FIG. 4, the control circuitry 16 is configured to turn on the switch 28(3) to close the third switchable series path 22(3) and turn off the switch 30(3) to open the third switchable shunt path 24(3), turn off the switch 28(1) to open the first switchable series path 22(1) and turn on the switch 30(1) to close the first switchable shunt path 24(1), and turn off the switch 28(2) to open the second switchable series path 22(2) and turn on the switch 30(2) to close the second switchable shunt path 24(2). Thus, the switch device 12 presents the third filter capacitance of the third filter circuit 32(3) at the common port 18 and does not present the third device capacitance at the common port 18, the switch device 12 does not present the first filter capacitance of the first filter circuit 32(1) at the common port 18 and does present the first device capacitance at the common port 18, and the switch device 12 does not present the second filter capacitance of the second filter circuit 32(2) at the common port 18 and does present the second device capacitance at the common port 18. Note that the off switch capacitance CO(3) (shown in FIG. 1) is not provided since the switch 28(3) is turned on while the off switch capacitance CO(1) and the off switch capacitance CO(2) are provided since the switch 28(1) and the switch 28(2) are turned off. The first filter capacitance of the first filter circuit 32(1) at the common port 18 and the second filter capacitance of the second filter circuit 32(2) are not presented at the common port 18 of the switch device 12 because the switch 30(1) and the switch 30(2) are turned off. Accordingly, the switch device 12, as shown in FIG. 4, is provided to present the third filter capacitance of the third filter circuit 32(3) at the common port 18 since the off switch capacitance CO(3) is not provided when the switch 28(3) is turned on and since the third capacitance of the third capacitive element 26(3) is shorted by the closing of the switch 28(3). The first device capacitance (i.e., the combination of the first capacitance of the first capacitive element 26(1) and the off switch capacitance CO(1)) is presented at the common port 18 since the switch 28(1) is turned off. The first filter capacitance of the first filter circuit 32(1) is not presented at the common port 18 because the switch 30(1) is turned on thereby shorting the first filter capacitance to ground. The second device capacitance (i.e., the combination of the second capacitance of the second capacitive element 26(2)

and the off switch capacitance CO(2)) is presented at the common port 18 since the switch 28(2) is turned off. The second filter capacitance of the second filter circuit 32(2) is not presented at the common port 18 because the switch 30(2) is turned on thereby shorting the second filter capacitance to ground. Accordingly, the total capacitance presented at the common port 18 of the switch device 12 is the combination of the third filter capacitance, the first device capacitance, and the second device capacitance.

RF signals within the RF bands of the filter 34(3) can thus pass to or from the common port 18 of the switch device 12 from or to the RF port 36(3) of the third filter circuit 32(3).

FIG. 5 illustrates the RF front end circuitry 10 shown in FIG. 1 with the switch device 12 set to route RF signals to the second filter circuit 32(2) and to the third filter circuit 32(3), simultaneously. In FIG. 5, the control circuitry 16 has provided a permutation of the switch control output 42 to the switch device 12 that indicates that the second switchable series path 22(2) should be closed while the second switchable shunt path 24(2) should be open, the third switchable series path 22(3) should be closed while the third switchable shunt path 24(3) should be open, and the first switchable series path 22(1) should be open while the first switchable shunt path 24(1) should be closed. The switch device 12 responds in accordance with the permutation of the switch control output 42 so that the second switchable series path 22(2) is closed while the second switchable shunt path 24(2) is open, the third switchable series path 22(3) is closed while the third switchable shunt path 24(3) is open, and the first switchable series path 22(1) is open while the first switchable shunt path 24(1) is closed.

More specifically, as shown in FIG. 5, the control circuitry 16 is configured to turn on the switch 28(2) to close the second switchable series path 22(2) and turn off the switch 30(2) to open the second switchable shunt path 24(2), to turn on the switch 28(3) to close the third switchable series path 22(3) and turn off the switch 30(3) to open the third switchable shunt path 24(3), and to turn off the switch 28(1) to open the first switchable series path 22(1) and turn on the switch 30(1) to close the first switchable shunt path 24(1). Thus, the second filter capacitance of the second filter circuit 32(2) is presented at the common port 18 and does not present the second device capacitance at the common port 18, the switch device 12 presents the third filter capacitance of the third filter circuit 32(3) at the common port 18 and does not present the third device capacitance at the common port 18, and the switch device 12 does not present the first filter capacitance of the first filter circuit 32(1) at the common port 18 and does present the first device capacitance at the common port 18. Note that the off switch capacitance CO(2) and the off switch capacitance CO(3) (shown in FIG. 1) are not provided since the switch 28(2) and the switch 28(3) are turned on, while the off switch capacitance CO(1) is provided since the switch 28(1) is turned off. The first filter capacitance of the first filter circuit 32(1) at the common port 18 is not presented at the common port 18 of the switch device 12 because the switch 30(1) is turned off. Accordingly, the switch device 12, as shown in FIG. 5, is provided to present the second filter capacitance of the second filter circuit 32(2) and the third filter capacitance of the third filter circuit 32(3) at the common port 18 since the off switch capacitance CO(2) and the off switch capacitance CO(3) are not provided when the switch 28(2) and switch 28(3) is turned on and since the second capacitance of the second capacitive element 26(2) and the third capacitance of the third capacitive element 26(3) are shorted by the closing of the switches 28(2), 28(3). The first device capacitance (i.e., the combination of the first capacitance of the first capacitive element 26(1) and the off switch capacitance CO(1)) is presented at the common port 18 since the switch 28(1) is turned off. The first filter capacitance of the first filter circuit 32(1) is not presented at the common port 18 because the switch 30(1) is turned on thereby shorting the first filter capacitance to ground. Accordingly, the total capacitance presented at the common port 18 of the switch device 12 is the combination of the first filter capacitance, the second device capacitance, and the third device capacitance.

RF signals within the RF bands of the filters 34(2), 34(3) can thus pass to or from the common port 18 of the switch device 12 from or to the RF ports 36(2), 36(3) of the filter circuits 32(2), 32(3) simultaneously.

FIG. 6 illustrates the RF front end circuitry 10 shown in FIG. 1 with the switch device 12 set to route RF signals to the first filter circuit 32(2), to the second filter circuit 32(2) and to the third filter circuit 32(3), simultaneously. In FIG. 6, the control circuitry 16 has provided a permutation of the switch control output 42 to the switch device 12 that indicates that the first switchable series path 22(1) should be closed while the first switchable shunt path 24(1) should be open, the second switchable series path 22(2) should be closed while the second switchable shunt path 24(2) should be open, and the third switchable series path 22(3) should be closed while the third switchable shunt path 24(3) should be open. The switch device 12 responds in accordance with the permutation of the switch control output 42 so that the first switchable series path 22(1) is closed while the first switchable shunt path 24(1) is open, the second switchable series path 22(2) is closed while the second switchable shunt path 24(2) is open, and the third switchable series path 22(3) is closed while the third switchable shunt path 24(3) is open.

More specifically, as shown in FIG. 6, the control circuitry 16 is configured to turn on the switch 28(1) to close the first switchable series path 22(1) and turn off the switch 30(1) to open the first switchable shunt path 24(1), to turn on the switch 28(2) to close the second switchable series path 22(2) and turn off the switch 30(2) to open the second switchable shunt path 24(2), and to turn on the switch 28(3) to close the third switchable series path 22(3) and turn off the switch 30(3) to open the third switchable shunt path 24(3). Thus, the first does present the filter capacitance of the first filter circuit 32(1) at the common port 18 and does not present the first device capacitance at the common port 18, does present the second filter capacitance of the second filter circuit 32(2) at the common port 18 and does not present the second device capacitance at the common port 18, and the switch device 12 presents the third filter capacitance of the third filter circuit 32(3) at the common port 18 and does not present the third device capacitance at the common port 18. Note that the off switch capacitance CO(1), the off switch capacitance CO(2), and the off switch capacitance CO(3) (shown in FIG. 1) are not provided since the switch 28(1), the switch 28(2), and the switch 28(3) are turned on. Accordingly, the switch device 12, as shown in FIG. 6, is provided to present the first filter capacitance of the first filter circuit 32(1), the second filter capacitance of the second filter circuit 32(2), and the third filter capacitance of the third filter circuit 32(3) at the common port 18 since the off switch capacitance CO(1), the off switch capacitance CO(2), and the off switch capacitance CO(3) are not provided when the switch 28(1), the switch 28(2), and switch 28(3) are turned on and since the first capacitance of the first capacitive element 26(1), the second capacitance of the second capacitive element 26(2), and the third capacitance of the third capacitive element 26(3) are shorted by the closing of the switches 28(1), 28(2), 28(3). Accordingly, the total capacitance presented at the common port 18 of the switch device 12 is the combination of the first filter capacitance, the second filter capacitance, and the third filter capacitance.

RF signals within the RF bands of the filters 34A, 34B, 34C, 34(2), 34(3) can thus pass to or from the common port 18 of the switch device 12 from or to the RF ports 36(1), 36(2), 36(3) of the filter circuits 32(1), 32(2), 32(3) simultaneously. Note that the total capacitance presented at the common port 18 of the switch device 12 remains approximately the same in FIG. 2-6 because the first filter capacitance and the first device capacitance are approximately the same, the second filter capacitance and the second device capacitance are approximately the same, and third filter capacitance and the third device capacitance are approximately the same.

Figure 7:
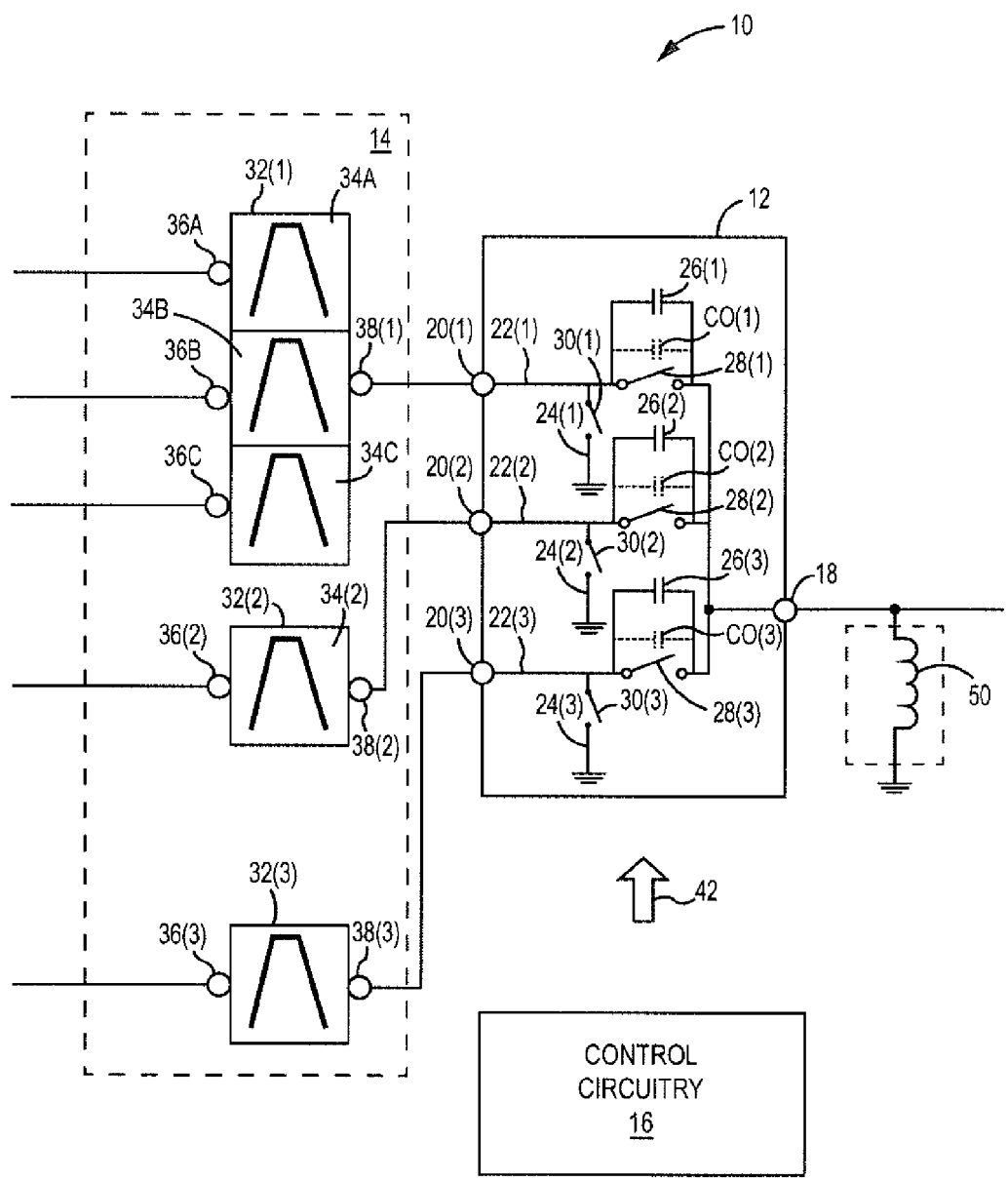
FIG. 7 illustrates another embodiment of the RF front end circuitry shown in FIG. 1 having an inductor connected in shunt with respect to the common port of the switch device.

FIG. 7 illustrates another embodiment of the RF front end circuitry 10 that is the same as the embodiment shown in FIG. 1, except that the RF front end circuitry 10 shown in FIG. 7 further includes an inductor 50. The inductor 50 is coupled to the common port 18 of the switch device 12. In this embodiment, the inductor 50 is connected in shunt with respect to the common port 18. The inductor 50 thus resonates with the total capacitance presented at the common port 18 of the switch device 12. As discussed above with respect to FIGS. 1-6, the total capacitance presented at the common port 18 is maintained substantially unchanged. In this manner, the inductor 50 is built to have an inductance so as to resonate out the total capacitance presented at the common port 18. As such, the impedance of the resonator formed by the inductor 50 and the total capacitance at the common port 18 may be provided as 50 Ohms. Otherwise, the embodiment shown in FIG. 7 operates in the same manner described above with respect to FIGS. 1-6.

Figure 8:
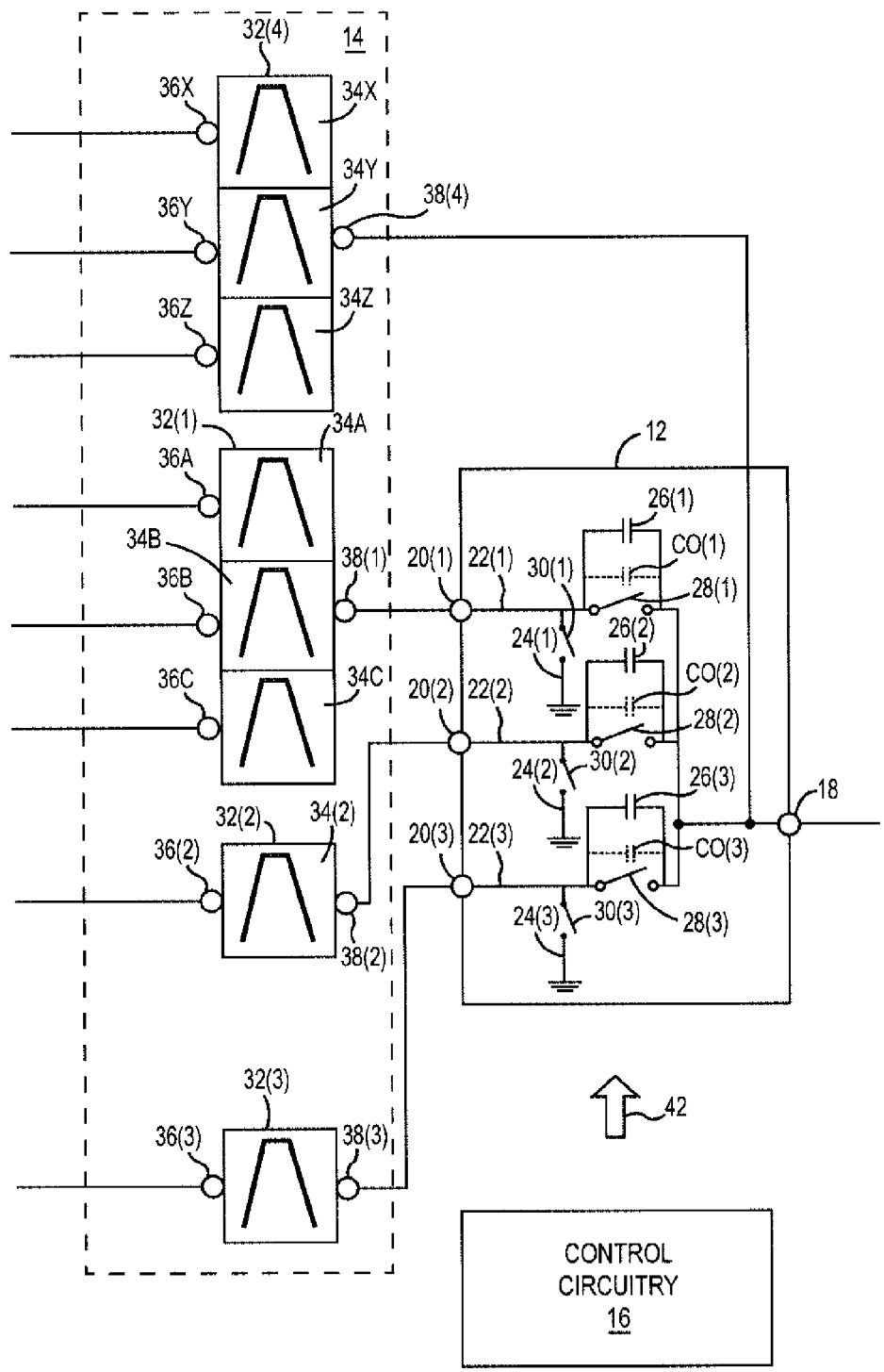
FIG. 8 illustrates another embodiment of the RF front end circuitry shown in FIG. 1 where the filtering circuitry further includes an additional filter circuitry directly connected to the common port of the switch device.

FIG. 8 illustrates another embodiment of the RF front end circuitry 10 that is the same as the embodiment shown in FIG. 1 except that the RF front end circuitry 10 shown in FIG. 8 further includes a fourth filter circuit 32(4), which is another multiplexer and more specifically another triplexer. In the illustrated embodiment, the fourth filter circuit 32(4) is a multiplexer that includes a plurality of filters 34X, 34Y, 34Z (referred to collectively or generically as filter(s) 34(4)), RF ports 36X, 36Y, 36Z (referred to collectively or generically as RF port(s) 36(4)) and a common port 38(4). In this specific embodiment, the fourth filter circuit 32(4) is a triplexer and thus includes three filters, mainly, the filter 34X, the filter 34Y, and the filter 34Z and three RF ports 36X, 36Y, 36Z. However, it should be noted that in alternative embodiments, the fourth filter circuit 32(4) or any of the other filter circuits 32(4), 32(3) may include any number of filters and RF ports.

Each of the RF ports 36X, 36Y, 36Z is connected to a different corresponding one of the plurality of filters 34X, 34Y, 34Z, and each of the plurality of filters 34 is connected to the common port 38(4). As such, the filter 34X is connected between the common port 38(4) and the RF port 36X. The filter 34X is configured to provide an RF passband so that RF signals within the RF passband are passed through the filter 34X to and/or from the common port 38(4) from and/or to the RF port 36X. The filter 34Y is connected between the common port 38(4) and the RF port 36Y. The filter 34Y is configured to provide an RF passband so that RF signals within the RF passband are passed through the filter 34Y to and/or from the common port 38(4) from and/or to the RF port 36Y. The filter 34Z is connected between the common port 38(4) and the RF port 36Z. The filter 34Z is configured to provide an RF passband so that RF signals within the RF passband are passed through the filter 34Z to and/or from the common port 38(4) from and/or to the RF port 36Z.

The fourth filter circuit 32(4), which in this example is a multiplexer, is configured to present a fourth filter capacitance at the common port 38(4). Since the fourth filter circuit 32(4) is a multiplexer (more specifically in this example a triplexer), the fourth filter capacitance is provided as a network capacitance at the common port 38(4) of the combination of the plurality of filters 34X, 34Y, 34Z of the fourth filter circuit 32(4). The common port 38(4) of the fourth filter circuit 32(4) is connected directly to the common port 18 of the switch device 12. In this manner, the fourth filter capacitance is always presented at the common port 18(1) of the switch device 12 since the fourth filter circuit 32(4) bypasses the switchable series paths 22 of the switch device 12. The total capacitance presented at the common port 18 will thus be a combination the first filter capacitance or the first device capacitance, the second filter capacitance or the second device capacitance and the third filter capacitance or the third device capacitance with the fourth filter capacitance. Otherwise, the embodiment shown in FIG. 8 operates in the same manner described above with respect to FIGS. 1-6.

FIG. 9 illustrates another embodiment of the RF front end circuitry 10 shown in FIG. 1 except that the RF front end circuitry 10 shown in FIG. 9 does not include the first capacitive element 26(1), the second capacitive element 26(2), and the third capacitive element 26(3). Furthermore, in this embodiment, the switch 28(1) is operable to provide the first device capacitance, which is the off switch capacitance $CO(1)$ of the switch 28(1) when the switch 28(1) is turned off and the switch 30(1) is turned on. As described with respect to the embodiments in FIGS. 1-8, the first device capacitance is approximately equal to the first device capacitance. Accordingly, in this embodiment, the switch 28(1) has been specifically configured so that the off switch capacitance $CO(1)$ of the switch 28(1) is approximately equal to the first device capacitance of the first filter circuit 32(1). For example, the switch 28(1) shown in FIG. 9 may be formed to have a width selected so that the off switch capacitance $CO(1)$ is approximately equal to the first device capacitance of the first filter circuit 32(1).

Also, in this embodiment, the switch 28(2) is operable to provide the second device capacitance is the off switch capacitance $CO(2)$ of the switch 28(2) when the switch 28(2) is turned off and the switch 30(2) is turned on. As described with respect to the embodiments in FIGS. 1-8, the second device capacitance is approximately equal to the second device capacitance. Accordingly, in this embodiment, the switch 28(2) has been specifically configured so that the off switch capacitance $CO(2)$ of the switch 28(2) is approximately equal to the second device capacitance of the second filter circuit 32(2). For example, the switch 28(2) shown in FIG. 9 may be formed to have a width selected so that the off switch capacitance $CO(2)$ is approximately equal to the second device capacitance of the second filter circuit 32(2).

Finally, in this embodiment, the switch 28(3) is operable to provide the third device capacitance is the off switch capacitance $CO(3)$ of the switch 28(3) when the switch 28(3) is turned off and the switch 30(3) is turned on. As described with respect to the embodiments in FIGS. 1-8, the third device capacitance is approximately equal to the third device capacitance. Accordingly, in this embodiment, the switch 28(3) has been specifically configured so that the off switch capacitance CO(3) of the switch 28(3) is approximately equal to the third device capacitance of the third filter circuit 32(3). For example, the switch 28(3) shown in FIG. 9 may be formed to have a width selected so that the off switch capacitance CO(3) is approximately equal to the third device capacitance of the third filter circuit 32(3). Otherwise, the embodiment shown in FIG. 9 operates in the same manner described above with respect to FIGS. 1-6.

FIG. 10 is an illustration of one embodiment of RF front end circuitry 60 which has the filtering circuitry 14 described above with respect to FIG. 1 and the control circuitry 16 described above with respect to FIG. 1. The filtering circuitry 14 is thus configured to present the filter capacitances of the filter circuits 32 to RF ports 20, as described above with respect to FIG. 1. Thus, a different one of the filter capacitances is presented to each of the RF ports 20, as described above with respect to FIG. 1. In this embodiment, the RF front end circuitry 60 includes the switch device 62 instead of the switch device 12 shown in FIG. 1 and a variable capacitive element 64. The switch device 62 is the same as the switch device 12 shown in FIG. 1 except that the switch device 62 does not include the first capacitive element 26(1), the second capacitive element 26(2), and the third capacitive element 26(3). In this embodiment, the first device capacitance is the off switch capacitance CO(1), the second device capacitance is the off switch capacitance CO(2), and the third device capacitance is the off switch capacitance CO(3). However, unlike the embodiment described above with respect to FIG. 9, the off switch capacitance CO(1) of the switch 28(1) is not provided to approximately equal the first filter capacitance of the first filter circuit 32(1), the off switch capacitance CO(2) of the switch 28(2) is not provided to approximately equal the second filter capacitance of the second filter circuit 32(2), and the off switch capacitance CO(3) of the switch 28(3) is not provided to approximately equal the third filter capacitance of the third filter circuit 32(3). Nevertheless, the control circuitry 16 is configured to generate the switch control output 42 so as to operate the switch device 62 in the same manner described above with respect to the switch device 12 in FIGS. 1-9. The control circuitry 16 is thus configured to open and close different combinations of the switchable series paths 22 and close and open different combinations of the switchable shunt paths 24, as described above with respect to FIGS. 1-6.

However, as mentioned above, the switch device 62 shown in FIG. 10 does not include the first capacitive element 26(1), the second capacitive element 26(2), and the third capacitive element 26(3), and the switch device 62 does not provide the off switch capacitance CO(1) of the switch 28(1) approximately equal to the first filter capacitance of the first filter circuit 32(1), does not provide the off switch capacitance CO(2) of the switch 28(2) approximately equal to the second filter capacitance of the second filter circuit 32(2), and does not provide the off switch capacitance CO(3) of the switch 28(3) approximately equal to the third filter capacitance of the third filter circuit 32(3). Therefore, the first device capacitance is not approximately equal to the first filter capacitance, the second device capacitance is not approximately equal to the second filter capacitance, and the third device capacitance is not approximately equal to the third filter capacitance.

Instead, the variable capacitive element 64 is provided to maintain a total capacitance presented at the common port 18 which in this example is a node, substantially unchanged for every one of the different combinations of switchable series paths 22 opened and closed (along with the corresponding combinations of switchable shunt paths 24 opened and closed). The variable capacitive element 64 is operable to provide a variable capacitance, and the variable capacitive element 64 is coupled to the common port 18. More specifically, the variable capacitive element 64 is connected in shunt with respect to the common port 18. The control circuitry 16 is configured to adjust the variable capacitance of the variable capacitive element 64 so that the total capacitance presented at the common port 18 remains approximately unchanged for every one of the different combinations of switchable series paths 22 opened and closed (along with the corresponding combinations of switchable shunt paths 24 opened and closed). In this embodiment, the control circuitry 16 is configured to generate an impedance control output 66. The variable capacitive element 64 is configured to receive the impedance control output 66 and is configured to set the variable capacitance of the variable capacitive element 64 based on the impedance control output 66. Each particular permutation of the impedance control output 66 sets the variable capacitance so that the total capacitance is maintained substantially unchanged. The total capacitance will thus be provided approximately as the combination of the variable capacitance, any of the device capacitances presented at the common port 18 for the switchable series paths 22 that are opened, and any of the filter capacitances presented at the common port 18 for any of the switchable series paths 22 that are closed. The variable capacitance is thus adjusted by the control circuitry 16 to compensate for the differences between the device capacitances and the filter capacitances of the switchable series paths 22 that are opened. In this manner, the total capacitance is maintained substantially unchanged for every one of the different combinations of switchable series paths 22 opened and closed (along with the corresponding combinations of switchable shunt paths 24 opened and closed). The variable capacitive element 64 may be provided as any component suitable to provide a variable capacitance. For example, the variable capacitive element 64 may be provided as a varactor or as a programmable array of capacitors.

FIG. 11 is an illustration of another embodiment of RF front end circuitry 60. The RF front end circuitry 60 is the same as the embodiment shown in FIG. 10 except that the RF front end circuitry 60 shown in FIG. 11 includes the inductor 50 described above with respect to FIG. 5, and the switch device 62 further includes, the first capacitive element 26(1), the second capacitive element 26(2), and the third capacitive element 26(3). In this embodiment, the first device capacitance is a parallel combination of the off switch capacitance CO(1) and the first capacitance of the first capacitive element 26(1), the second device capacitance is a parallel combination of the off switch capacitance CO(2) and the second capacitance of the second capacitive element 26(2), and the third device capacitance is a parallel combination of the off switch capacitance CO(3) and the third capacitance of the third capacitive element 26(3). However, unlike the embodiment described above with respect to FIG. 1-8, the first device capacitance is not approximately equal to the first filter capacitance, the second device capacitance is not approximately equal to the second filter capacitance, and the third device capacitance is not approximately equal to the third filter capacitance. In other words, the capacitances of the capacitive elements 26 are do not provide sufficient compensation so that the device capacitances approximately equal the filter capacitances.

Instead, as in the embodiment described above with respect to FIG. 10, the control circuitry 16 is configured to adjust the variable capacitance of the variable capacitive element 64 so that the total capacitance presented at the common port 18 remains approximately unchanged for every one of the different combinations of switchable series paths 22 opened and closed (along with the corresponding combinations of switchable shunt paths 24 opened and closed). In this embodiment, each particular permutation of the impedance control output 68 sets the variable capacitance so that the total capacitance is maintained substantially unchanged. The total capacitance will thus be provided approximately as the combination of the variable capacitance, any of the device capacitances presented at the common port 18 for the switchable series paths 22 that are opened, and any of the filter capacitances presented at the common port 18 for any of the switchable series paths 22 that are closed. The variable capacitance is thus adjusted by the control circuitry 16 to compensate for the differences between the device capacitances and the filter capacitances of the switchable series paths 22 that are opened. In this manner, the total capacitance is maintained substantially unchanged for every one of the different combinations of switchable series paths 22 opened and closed (along with the corresponding combinations of switchable shunt paths 24 opened and closed). The inductor 50 may thus resonate with the total capacitance provided from the switch device 62 and the variable capacitive element 64. Accordingly, the inductance of the inductor 50 may be provided to resonate out the total capacitance.

Those skilled in the art will appreciate the scope of the present disclosure and realize additional aspects thereof after reading the following detailed description of the preferred embodiments in association with the accompanying drawing figures.

What is claimed is:

1. Radio frequency (RF) front end circuitry comprising:
a first filter circuit coupled to a first RF port, wherein the first filter circuit is configured to present a first filter capacitance to the first RF port; and
a switch device comprising a common port, the first RF port, a first switchable path operable to be opened and closed and connected in series between the common port and the first RF port, wherein the switch device is configured to:
present approximately the first filter capacitance of the first filter circuit at the common port when the first switchable path is closed; and
present approximately a first device capacitance at the common port when the first switchable path is open, wherein a total capacitance presented at the common port is maintained independent of the first switchable path being open or closed.

2. The RF front end circuitry of claim 1 wherein the switch device is further configured to:
not present approximately the first filter capacitance at the common port when the first switchable path is open; and
not present approximately the first device capacitance at the common port when the first switchable path is closed.

3. The RF front end circuitry of claim 1 wherein the switch device further comprises a first switch connected in series within the first switchable path and a first switchable shunt path, wherein:
the first switch is operable to be turned on so that the first switchable path is closed and is operable to be turned off so that the first switchable path is opened;

the first switchable shunt path is operable to be opened and closed, wherein the first switchable shunt path is connected in shunt to the first switchable path between the first switch and the first RF port; and
the switch device is configured to:
present approximately the first filter capacitance at the common port when the first switch is turned on and the first switchable shunt path is open; and
present approximately the first device capacitance at the common port when the first switch is turned off and the first switchable shunt path is closed.

4. The RF front end circuitry of claim 3 wherein the switch device further comprises a first capacitive element having a first capacitance wherein:
the first capacitive element is connected in parallel with the first switch; the first switch is operable to provide a first off switch capacitance when the first switch is turned off; and
wherein the first device capacitance is approximately equal to a combination of the first capacitance and the first off switch capacitance.

5. The RF front end circuitry of claim 3 wherein the first switch is operable to provide a first off switch capacitance when the first switch is turned off, wherein the first device capacitance is the first off switch capacitance.

6. The RF front end circuitry of claim 3 further comprising control circuitry configured to:
turn on the first switch to close the first switchable path and open the first switchable shunt path so that the switch device presents approximately the first filter capacitance at the common port; and
turn off the first switch to open the first switchable path and close the first switchable shunt path so that the switch device presents approximately the first device capacitance at the common port.

7. The RF front end circuitry of claim 1 wherein the first filter circuit is a multiplexer and wherein:
the multiplexer comprises a plurality of filters, RF ports, and a second common port;
each of the RF ports is connected to a different corresponding one of the plurality of filters;
each of the plurality of filters is connected to the second common port;
the second common port is connected to the first RF port; and
the first filter capacitance is provided at the common port.

8. The RF front end circuitry of claim 1 wherein the first filter circuit is a first filter connected to the first RF port and is configured to present the first filter capacitance at the first RF port.

9. The RF front end circuitry of claim 1 further comprising a second filter circuit wherein:
the switch device further comprises a second RF port and a second switchable path;
the second switchable path is operable to be opened and closed and is connected in series between the second RF port and the common port;
the second filter circuit is coupled to the second RF port, wherein the second filter circuit is configured to present approximately a second filter capacitance to the second RF port; and
the switch device is further configured to:
present approximately the second filter capacitance at the common port when the second switchable path is closed; and
present approximately a second device capacitance at the common port when the second switchable path is open, wherein the second device capacitance approximately equals the second filter capacitance.

10. The RF front end circuitry of claim 9 wherein the switch device is further configured to:
not present approximately the first filter capacitance at the common port when the first switchable path is open;
not present approximately the first device capacitance at the common port when the first switchable path is closed;
not present approximately the second filter capacitance at the common port when the second switchable path is open; and
not present approximately the second device capacitance at the common port when the second switchable path is closed.

11. The RF front end circuitry of claim 9 wherein the switch device further comprises a first switch, a second switch, a first switchable shunt path, and a second switchable shunt path and wherein:
the first switch is connected in series within the first switchable path, wherein the first switch is operable to be turned on so that the first switchable path is closed and is operable to be turned off so that the first switchable path is opened;
the first switchable shunt path is operable to be opened and closed, wherein the first switchable shunt path is connected in shunt to the first switchable path between the first switch and the first RF port;
the second switch is connected in series within the second switchable path, wherein the second switch is operable to be turned on so that the second switchable path is closed and is operable to be turned off so that the second switchable path is opened;
the second switchable shunt path is operable to be opened and closed, wherein the second switchable shunt path is connected in shunt to the second switchable path between the second switch and the second RF port; and
the switch device is configured to:
present approximately the first filter capacitance at the common port when the first switch is turned on and the first switchable shunt path is open;
present approximately the first device capacitance at the common port when the first switch is turned off and the first switchable shunt path is closed;
present approximately the second filter capacitance at the common port when the second switch is turned on and the second switchable shunt path is open; and
present approximately the second device capacitance at the common port when the second switch is turned off and the second switchable shunt path is closed.

12. The RF front end circuitry of claim 11 wherein the switch device further comprises a first capacitive element having a first capacitance and a second capacitive element having a second capacitance and wherein:
the first capacitive element is connected in parallel with the first switch; the first switch is operable to provide a first off switch capacitance when the first switch is turned off;
the first device capacitance is approximately equal to a combination of the first capacitance and the first off switch capacitance;
the second capacitive element is connected in parallel with the second switch;
the second switch is operable to provide a second off switch capacitance when the second switch is turned off; and
the second device capacitance is approximately equal to a combination of the second capacitance and the second off switch capacitance.

13. The RF front end circuitry of claim 11 wherein:
the first switch is operable to provide a first off switch capacitance when the first switch is turned off, wherein the first device capacitance is the first off switch capacitance; and
the second switch is operable to provide a second off switch capacitance when the second switch is turned off, wherein the second device capacitance is the second off switch capacitance.

14. The RF front end circuitry of claim 11 further comprising control circuitry configured to:
turn on the first switch to close the first switchable path and open the first switchable shunt path so that the switch device presents approximately the first filter capacitance at the common port;
turn off the first switch to open the first switchable path and close the first switchable shunt path so that the switch device presents approximately the first device capacitance at the common port;
turn on the second switch to close the second switchable path and open the second switchable shunt path so that the switch device presents approximately the second filter capacitance at the common port; and
turn off the second switch to open the second switchable path and close the second switchable shunt path so that the switch device presents approximately the second device capacitance at the common port.

15. The RF front end circuitry of claim 14 wherein the control circuitry is configured to operate the switch device such that any one from a first group and any one from a second group can be selected by the control circuitry and wherein:
the first group comprises:
turning on the first switch to close the first switchable path and opening the first switchable shunt path so that the switch device presents approximately the first filter capacitance at the common port; and
turning off the first switch to open the first switchable path and closing the first switchable shunt path so that the switch device presents approximately the first device capacitance at the common port;
the second group comprises:
turning on the second switch to close the second switchable path and opening the second switchable shunt path so that the switch device presents approximately the second filter capacitance at the common port; and
turning off the second switch to open the second switchable path and closing the second switchable shunt path so that the switch device presents approximately the second device capacitance at the common port; and
the switch device is configured such that the total capacitance presented at the common port is approximately unchanged for any selection by the control circuitry from the first group and the second group.

16. The RF front end circuitry of claim 15 further comprising an inductor coupled to the common port so that the inductor resonates with the total capacitance presented at the common port.

17. The RF front end circuitry of claim 9 further comprising a third filter circuit, wherein the switch device further comprises a third RF port and a third switchable path and wherein:

the third switchable path is operable to be opened and closed and is connected in series between the third RF port and the common port;

the third filter circuit is coupled to the third RF port, wherein the third filter circuit is configured to present approximately a third filter capacitance to the third RF port; and the switch device is further configured to:
  present approximately the third filter capacitance at the common port when the third switchable path is closed; and
  present approximately a third device capacitance at the common port when the third switchable path is open, wherein the third device capacitance approximately equals the third filter capacitance.

18. The RF front end circuitry of claim 17 wherein the switch device is further configured to:
  not present approximately the first filter capacitance at the common port when the first switchable path is open;
  not present approximately the first device capacitance at the common port when the first switchable path is closed;
  not present approximately the second filter capacitance at the common port when the second switchable path is open;
  not present approximately the second device capacitance at the common port when the second switchable path is closed;
  not present approximately the third filter capacitance at the common port when the third switchable path is open; and
  not present approximately the third device capacitance at the common port when the third switchable path is closed.

19. The RF front end circuitry of claim 1 further comprising a second filter circuit connected directly to the common port.

20. Radio frequency (RF) front end circuitry comprising:
  a filtering circuitry configured to present filter capacitances to RF ports such that a different one of the filter capacitances is presented to each of the RF ports;
  a switch device having a common port, the RF ports, and switchable paths wherein each switchable path of the switchable paths is connected between the common port and a different corresponding one of the RF ports and is operable to be opened and closed;
  a variable capacitive element operable to provide a variable capacitance, wherein the variable capacitive element is coupled to the common port; and
  control circuitry configured to:
    open and close different combinations of the switchable paths; and
    adjust the variable capacitance of the variable capacitive element so that a total capacitance presented at the common port is maintained independent of the switchable paths being open or closed.

* * * * *